United States Patent [19]
Iwasaki et al.

[11] Patent Number: 5,945,716
[45] Date of Patent: *Aug. 31, 1999

[54] SEMICONDUCTOR WAFER AND DEVICE STRUCTURE

[75] Inventors: Masanobu Iwasaki; Katsuhiro Tsukamoto, both of Hyogo-ken, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 07/971,041

[22] Filed: Nov. 3, 1992

[30] Foreign Application Priority Data

Nov. 27, 1991 [JP] Japan .................................. 3-312257

[51] Int. Cl.⁶ ............................. H01L 29/76; H01L 29/94
[52] U.S. Cl. ..................... 257/383; 257/382; 257/501; 257/506; 257/508; 257/524; 257/725
[58] Field of Search .................................. 257/382, 383, 257/621, 622, 501, 506, 508, 520, 524, 725

[56] References Cited

U.S. PATENT DOCUMENTS

| | | | |
|---|---|---|---|
| 4,392,150 | 7/1983 | Courreges | 257/383 |
| 4,924,284 | 5/1990 | Beyer et al. | 257/621 |
| 4,977,439 | 12/1990 | Esquivel et al. | 257/621 |
| 5,014,104 | 5/1991 | Ema | 257/383 |
| 5,045,916 | 9/1991 | Vor et al. | 257/383 |
| 5,128,744 | 7/1992 | Asano et al. | 257/508 |

FOREIGN PATENT DOCUMENTS

| | | |
|---|---|---|
| 3143216 C2 | 6/1982 | Germany . |
| 4020195 A1 | 1/1991 | Germany . |
| 2-188942 | 7/1990 | Japan . |
| 2-211652 | 8/1990 | Japan . |

*Primary Examiner*—Valencia Martin-Wallace
*Attorney, Agent, or Firm*—McDermott, Will & Emery

[57] ABSTRACT

On a surface of a semiconductor substrate within a device forming region, a MOS transistor including a gate electrode, gate oxide film and source•drain is formed. An insulating layer is formed on the surface of the semiconductor substrate. In an opening of the insulating layer above the source•drain, a tungsten plug is formed. At a dicing line portion, the insulating layer has a trench portion. The trench portion is formed to surround the device forming region. A tungsten street having a top surface continuous to the top surface of the insulating layer is formed in the trench. By this semiconductor device, short-circuit between bonding pads and the like can be prevented, and the reliability can be improved.

20 Claims, 31 Drawing Sheets

(a)

(b)

(c)

(a)

(b)

SEMICONDUCTOR WAFER AND DEVICE STRUCTURE

BACKGROUND OF THE INVENTION

1. Field of the Invention

The present invention relates to semiconductor devices such as integrated circuits and manufacturing method thereof. More specifically, it relates to an improved semiconductor wafer and device structure, and improvement of the manufacturing method thereof.

2. Description of the Background Art

Recently, the degree of integration of semiconductor integrated circuits has been much improved. As the degree of integration increases, the diameter of contact holes is made smaller, and impurity regions are formed shallower. Further, as the number of interconnection layers increase and provided in the form of multiple layers, inter-insulating layers insulating the interconnection layers from each other are stacked thick one after another. Consequently, the aspect ratio (depth/diameter) of the contact hole is increased.

Conventionally, an interconnection layer of aluminum•silicon (AlSi) or the like has been deposited by sputtering. However, because of directivity of plasma, a contact hole can not be covered by a film of uniform thickness by sputtering. Especially at sidewall portions and bottom portion of the contact hole, the interconnection layer becomes thin. Therefore, if the sidewall portion of the contact hole becomes steep, the interconnection layer is disconnected at the sidewall portion and the bottom portion.

In order to avoid the above described problem, recently a tungsten (W) plug utilizing CVD (Chemical Vapor Deposition) method has been developed. Reduction of tungsten hexafluoride ($WF_6$) using hydrogen ($H_2$) or silane ($SiH_4$) have been known as methods for forming a tungsten thin film by using the CVD method. Respective reaction formulas for reduction of $WF_6$ are as follows:

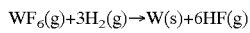

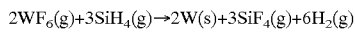

where (g) and (s) denote gas phase and solid phase, respectively.

The CVD-tungsten plug forming technique includes selective tungsten formation and etchback tungsten plug formation. Selective tungsten formation refers to a technique in which tungsten is grown or applied only in the contact hole, and for this reason, it is regarded as an ideal technique of filling. However, it has not yet been practically utilized because of the following reasons.

One reason is that the growth or application of tungsten in selective tungsten formation is sensitive to the surface condition. In selective tungsten formation, since growth of tungsten is sensitive to the surface condition, the growth reaction of tungsten differs dependent on underlayers. More specifically, when contact holes are formed not only on n type and p type impurity layers but also on underlayers such as n type and p type polysilicon (poly-Si) layer, tungsten polycide ($WSi_x$/poly-Si) layer and titanium silicide ($TiSi_2$) layer, it is difficult to uniformly fill all these contact holes formed on different underlayers. In addition, the depth of a contact hole with the silicon substrate being the underlying layer is different from the depth of a contact hole with a polysilicon layer being the underlying layer because of the thickness of polysilicon layer stacked on the substrate, and hence it is impossible to uniformly fill these contact holes.

Secondary, growth of tungsten is also sensitive to the surface condition of the insulating film in selective tungsten formation. More specifically, if there is a little residue or damage of the preceding steps left on the insulating film, such portion becomes a nuclear formation site, on which tungsten grows and will adhere. In this manner, a phenomenon of "lost selectivity" occurs and tungsten grows and remains not only in the contact holes but also on the insulating film.

From these reasons, selective tungsten formation is not practical.

Etchback tungsten plug formation refers to a technique in which a barrier metal such as titanium nitride (TiN) or titanium tungsten (TiW) is formed as a glue layer. A tungsten film is deposited entirely over the wafer and the tungsten is etched back entirely to leave tungsten plugs in contact holes. Compared with the aforementioned selective tungsten formation, the etchback tungsten plug formation is relatively easy, and practical application is expected. A conventional semiconductor device manufactured by using the etchback tungsten plug formation and manufacturing method thereof will be described in the following.

First, the structure of the conventional semiconductor device will be described.

FIG. 29 is a plan view schematically showing a conventional wafer. FIG. 30 is an enlarged plan view showing a portion B of FIG. 29. Referring to these figures, a plurality of device regions 260 are formed on the wafer 300. Device regions 260 are manufactured through etchback tungsten plug process. Dicing line portions 250 at which device regions are not formed exist between device regions 260. Alignment marks 220 are formed on dicing line portion 250. Alignment mark 220 is a projecting mark. Dicing line portion 250 is the region which is cut when wafer 300 is divided into chips, and it is cut along the line j—j, for example.

FIG. 31 is a partial cross section taken along the line n—n of FIG. 30, and FIG. 32 is a partial cross section taken along the line o—o of FIG. 30.

FIG. 31 shows a cross section of a portion where the alignment mark is not formed on the dicing line. Before cutting at dicing, dicing line portion 250 exists between device forming regions 260. As to the device forming region 260, an oxide film 203 for isolating element is formed on the surface of a semiconductor substrate 202. Between the oxide films 203, an MOS transistor 230 is formed. The MOS transistor 230 includes a gate electrode 204, a gate oxide film 205 and an impurity diffused region 206. An insulating layer 207 is formed on the surface of semiconductor substrate 202 in the device forming region 260. Insulating layer 207 has an opening 252 above the impurity diffused region 206. The surface of a portion of impurity diffused region 206 is exposed through this opening 252. A barrier metal 208 is formed thin in the periphery of the insulating layer 207, and at the sidewall portions and the bottom portion of the openings 252. The barrier metal 208 is formed of TIN/Ti. The opening 252 of insulating layer 207 is filled with a tungsten plug 201b. On the surface of insulating layer 207 and on tungsten plug 201, a first aluminum interconnection layer 209 is formed. The first aluminum interconnection layer 209 is electrically connected to impurity diffused region 206 through tungsten plug 201b. An interlayer insulating film 210 is formed on the surface of insulating layer 207 on which the first aluminum interconnection layer 209 is formed. A through hole 253 is provided in interlayer insulating film 210 on the first aluminum interconnection layer 209. A portion of the surface of the first aluminum interconnection layer 209 is exposed through this through hole 253. On the interlayer insulating film 210, a second aluminum interconnection layer 211 is formed. The second aluminum interconnection layer 211 is electrically connected to the first aluminum interconnection layer 209 through the through hole 253 of the interlayer insulating film 210. A passivation film 212 is formed to cover the surface of the second aluminum interconnection layer 211. The passivation film 212 has an opening. Through this opening, a portion of the surface of the second aluminum interconnection layer 212 is exposed, thus forming a bonding pad portion 213.

As to the dicing line portion 250, there is nothing formed on the surface of semiconductor substrate 202, and the surface of semiconductor substrate 202 is made rough because of etchback carried out to form the tungsten plug 201b. For simplicity, part of the dicing line portion 250 is not shown in the figure.

FIG. 32 is a cross section of a portion where an alignment mark is formed at the dicing line portion. Before cutting at dicing, dicing line portion 250 exists between device forming regions 260. The structure of the device forming region 260 is the same as that of FIG. 31 but with an alignment mark. A plurality of projecting alignment marks 220 are formed at dicing line portion 250. The surface of semiconductor substrate 202 where alignment mark 220 is not formed is made rough because of etchback for forming tungsten plug 201b. For simplicity, only a part of dicing line portion 250 is shown.

The conventional semiconductor device is structured as described above.

A method of manufacturing the conventional semiconductor device will be described in the following with reference to respective cross sections taken along the lines n—n and o—o of FIG. 30.

FIGS. 33 to 40 are cross sections taken along the line n—n of FIG. 30 showing, in order, the method of manufacturing the conventional semiconductor device. FIGS. 41 to 48 are cross sections taken along the line o—o of FIG. 30 showing, in order, the method of manufacturing the conventional semiconductor device.

Referring to FIGS. 33 and 41, an oxide film 203 for isolating elements is formed on semiconductor substrate 202. A MOS transistor 230 including a gate electrode 204, a gate oxide film 205 and an impurity diffused region 206 is formed at a region between oxide films 203. On the surface of semiconductor substrate 202, an insulating layer 207 is formed. A contact hole 252 is formed in the insulating layer 207 above impurity diffused region 206 by etching. Insulating layer 207 is also removed by etching in the region of dicing line portion 250. Referring particularly to FIG. 41, when insulating layer 207 is selectively removed from the region of dicing line portion 250, a plurality of alignment marks 220 are formed.

Referring to FIGS. 34 and 42, a barrier metal of TiN/Ti is formed by sputtering on the surface of semiconductor substrate 202.

Referring to FIGS. 35 and 43, a tungsten layer 201 is deposited by CVD method on the surface of semiconductor substrate 202. Thus, contact hole 252 is filled with a tungsten layer 201.

Referring to FIGS. 36 and 44, the entire surface of the deposited tungsten layer 201 is etched back. Thus a tungsten plug 201b is provided. By this etchback, the surface of semiconductor substrate 202 is made rough at the dicing line portion 250. Tungsten layer 201a is left as residue in the periphery of insulating layer 207. Referring particularly to FIG. 44, tungsten layer 201a is also left as residue in the vicinity of alignment mark 220. Referring to FIGS. 37 and 45, a first aluminum layer is formed on the entire surface of semiconductor substrate 202. The aluminum layer is etched and an aluminum interconnection layer 209 is formed. The first aluminum interconnection layer 209 is left on tungsten plug 201b. Referring particularly to FIG. 45, the first aluminum interconnection layer 209 is left also on alignment mark 220.

Referring to FIGS. 38 and 46, an insulating layer is formed on the entire surface of semiconductor substrate 202. The insulating layer is etched and an interlayer insulating film 210 is formed. Interlayer insulating film 210 is left only on the surface of insulating layer 207. Interlayer insulating film 210 on a part of the surface of the first aluminum interconnection layer 209 is also removed by etching. Consequently, a through hole 253 is formed in interlayer insulating film 210, and a portion of the surface of the first aluminum interconnection layer 209 is exposed. Referring particularly to FIG. 46, interlayer insulating film 210 is also left on alignment mark 220.

Referring to FIGS. 39 and 47, a second aluminum layer is formed on the entire surface of semiconductor substrate 202. The second aluminum layer is etched and a second aluminum interconnection layer 211 is formed. The second aluminum interconnection layer 211 is left only on insulating layer 207. Referring especially to FIG. 47, the second aluminum interconnection layer 211 is left also on alignment mark 220.

Referring to FIGS. 40 and 48, a passivation layer is formed on the entire surface of semiconductor substrate 202. The passivation layer is etched and a passivation film 212 is formed. By this etching, passivation film 212 is left to cover device forming portions 260. The passivation film 212 is also removed by etching from a portion of the surface of the second aluminum interconnection layer 211. Consequently, an opening is formed in passivation film 212, and a portion of the surface of second aluminum interconnection layer 211 is exposed. This exposed portion of the second aluminum interconnection layer 211 will be the bonding pad portion 213. Referring particularly to FIG. 48, passivation film 212 is also left on alignment mark 220.

The conventional semiconductor device is manufactured in the above described manner.

In the above described conventional semiconductor device, steps generated between the device forming region 260 and the dicing line portion 250 and steps generated by alignment marks can not be avoided as shown in FIGS. 31 and 32. Disadvantages derived from these steps will be described in the following.

FIG. 49 is a cross sectional view showing a step of forming tungsten plugs in a plurality of contact holes having different diameters. Referring to FIG. 49(a), contact hole H1 has the largest diameter, a contact hole H2 has smaller diameter, and a contact hole H3 has the smallest diameter. Referring to FIG. 49(b), a tungsten layer 201 is deposited on the entire surface. Referring to FIG. 49(c), the entire surface of tungsten layer 201 is etched back. Thus, a tungsten plug 201b is formed in the contact hole H3 having the smallest diameter. However, contact holes H2 and H1 having larger diameters than contact hole H3, filling of tungsten layer 201 is not sufficient, to fill holes H1 and H2 and therefore the substrate surface within H1 and H2 is made rough by etchback. This is because the thickness of tungsten layer 201 shown in the figure is too thin to fill contact holes H2 and H1. If the diameter is relatively near the diameter of contact hole H3 (for example, contact hole H2), the diameter can be adjusted to be the same as that of contact hole H3 by some change in design. Therefore, contact hole H2 can be fully filled, preventing roughness at the substrate surface. However, if the diameter is as large as that of contact hole H1, it is impossible to make small the diameter at the step of designing. It is impossible to fill the hole H1 by making the tungsten layer thicker. In a conventional semiconductor device, the portion of the contact hole H1 corresponds to the step portion generated by the dicing line or the alignment mark which is inevitable as described above. Therefore, at the step portion caused by the dicing line or the alignment mark, the substrate surface is made rough because of the etchback carried out when tungsten plug is formed. Especially at the dicing line, alignment marks are formed as shown in FIG. 30. The influence of the roughness of the substrate surface at the dicing line and the alignment marks will be described.

Generally, alignment of respective layers is carried out by using alignment marks. The alignment is carried out by scanning depressed or projecting alignment marks using He—Ne laser beam ($\lambda$=633 nm), and by recognizing the center of the pattern of the alignment marks in accordance with the intensity of the reflected light.

FIG. 50 shows cross sections of depressed (a) and projecting (b) alignment marks and alignment waveforms when substrate surface is not made rough. FIG. 51 shows cross sections of depressed (a) and projecting (b) alignment marks and alignment waveforms when substrate surface is made rough.

Referring to FIG. 50, when an aluminum interconnection layer is provided on contact holes without using the tungsten plug process, the step of etchback of the tungsten layer is not carried out. Therefore, the substrate surface is not made rough. Consequently, both depressed (a) and projecting (b) alignment marks exhibit superior alignment waveforms. This enables recognition of the center of the alignment mark pattern.

When tungsten plug process is employed, referring to FIG. 51, the substrate surface is made rough because of the step of etching back the tungsten layer. The alignment waveforms are disturbed because of the surface roughness. If the disturbance of the alignment waveforms is as small as shown in (a) exhibited by the depressed alignment marks, the center of the pattern can be recognized. Therefore it can be used. However, the waveforms are disturbed much when projecting alignment marks (b) are used, that it becomes difficult to recognize the center of the pattern.

As described above, the etchback tungsten plug formation has the problem of surface roughness which in turn causes decrease in alignment precision.

A method has been proposed to solve the above problem, in which an insulating film is left on the entire surface of the dicing lines. This method will be described in the following.

FIG. 52 is an enlarged plan view corresponding to the portion B of FIG. 29. An insulating film is left on the substrate at dicing line portion 350. A plurality of alignment marks 320 are formed at dicing line portion 350. Alignment marks 320 are depressed type marks. The dicing line portion 350 is a region cut during dicing, and it is cut along the line k—k, for example.

FIG. 53 is a cross section taken along the line p—p of FIG. 52, and FIG. 54 is a cross section taken along the line q—q of FIG. 52. The same portions as in FIG. 31 and 32 are denoted by the same or corresponding reference characters. Referring to these figures, an insulating layer 307 is left on a semiconductor substrate 302. Therefore, the surface of semiconductor substrate 302 is not made rough even by the etchback for forming tungsten plugs. A plurality of depressed type alignment marks 320 are formed on the insulating layer 307. Even if etchback for forming tungsten plugs is carried out as shown in FIG. 51($a$), the precision in alignment is not very much affected when depressed type alignment marks are used.

In this manner, by leaving an insulating film on the substrate at the dicing line portion, decrease of the alignment precision can be prevented. However, if the insulating layer is left as the dicing line portion as described above, the following problem arises when dicing is done along the line k—k of FIG. 52.

FIG. 55 is a cross section taken along the line p—p of FIG. 52 showing the manner of dicing along the line k—k of FIG. 52. Referring to FIG. 55, the insulating layer 307 and semiconductor substrate 302 at the dicing line are cut by a blade 340 of a dicer. However, during dicing, cracks are generated in insulating layer 307 and in semiconductor substrate 302. The cracks extend in insulating layer 307 to reach interconnection layer 315 of the device forming region 360 formed in the insulating layer 307. This causes short circuits between layers and decreases reliability.

Now, Japanese Patent Laying-Open No. 2-211652 discloses a structure of a semiconductor device which will be described in the following.

FIG. 56 is a cross sectional view showing schematically the structure of the semiconductor device disclosed in the above mentioned prior art. FIG. 56 shows a state before dicing the chip from the wafer, and there is a dicing line portion 450 which is cut during dicing, between device forming portions 460. An oxide film 403 for isolating elements is formed on the surface of the semiconductor substrate 402. An insulating layer 407 is formed on the surface of semiconductor substrate 402. The insulating layer 407 has an opening 451 in dicing line portion 450. Through this opening 451, a portion of the surface of semiconductor substrate 402 is exposed. At dicing line portion 450, a tungsten interconnection layer 401 is formed on insulating layer 407. The tungsten interconnection layer 401 covers insulating layer 407 at dicing line portion 450. Tungsten interconnection layer 401 fills the opening 451 in insulting layer 407. At device forming portions 460, an insulating film 423 is formed on insulating layer 407 and on tungsten interconnection layer 401.

The semiconductor device disclosed in the prior art is structured as described above. Referring now to FIG. 57. In this semiconductor device, the cracks in the insulating film 407 caused by dicing can be prevented from reaching other chips by the insulating layer 407 and tungsten plug 401 at the dicing line portion 450. However, the following problem still arises when the dicing line portion 450 is cut by the blade 440 of a dicer.

FIG. 58 is a perspective view showing the dicing line portion of the semiconductor device disclosed in the prior art after the cutting of the dicing line portion. Referring to FIG. 58, in the semiconductor device disclosed in the prior art, tungsten interconnection layer 401 is formed to cover the entire surface of insulating layer 407 at dicing line portion 450. Therefore, when it is cut, the tungsten interconnection layer 401 must be cut first, as shown in FIG. 57. By this cutting, pieces of tungsten interconnection layer 401 scatters and may possibly bridge bonding pads 413, as shown in FIG. 58. Cutting of the interconnection layer thus possibly causes a short-circuit between bonding pads. In addition, two layers, that is, tungsten interconnection layer 401 and insulating layer 407 must be cut. Therefore, if the tungsten interconnection layer 401 is formed of a material with high hardness, the blade 440 of the dicer wears, and the number of failure would be increased. In other words, this prior art has a problem of short life of the blade 440 of the dicer.

SUMMARY OF THE INVENTION

An object of the present invention is to make long the life of the blade of the dicer cutting a wafer into chips.

Another object of the present invention is to manufacture a semiconductor device enabling longer life of the blade of the dicer cutting a wafer into chips.

A further object of the present invention is to prevent a possible short-circuit between bonding pads which occurs when a wafer is cut into chips.

A still further object of the present invention is to manufacture a semiconductor device capable of preventing a possible short-circuit between bonding pads which occurs when a wafer is cut into chips.

The above described objects can be attained by a semiconductor wafer of the present invention including a semiconductor substrate including a plurality of semiconductor device regions and a plurality of dicing line regions separating the device regions. An insulation layer of a first material is formed on a surface of the semiconductor substrate. The insulation layer includes a plurality of apertures each surrounding a respective one of the device regions and electrically isolated from each other.

In this semiconductor wafer, a plurality of apertures are formed in the insulation layer. These apertures are provided surrounding the semiconductor device region. Consequently, when the dicing line region is cut, the way of the crack generated by cutting is obstructed by the apertures. Thus, the crack can not reach the semiconductor device region, and accordingly, short-circuit between layers can be prevented, ensuring the reliability.

In the present invention, preferably, the apertures are each filled with a layer of a second material confined to be within the apertures.

In the present invention, preferably, each of the apertures is continuous trench.

In the present invention, alternatively, each aperture comprises a plurality of openings.

In order to attain the above described objects, the semiconductor device in accordance with the present invention includes a semiconductor substrate, device forming regions, an insulating layer formed of a first material, and a filling layer formed of a second material. The semiconductor substrate has a main surface. The device forming region includes a device formed on the main surface of the semiconductor substrate. The insulating layer formed of the first material is formed to cover the device forming region. The insulating layer formed of the first material has a hole surrounding the device forming region and extending from the top surface of the insulating layer of the first material toward the main surface of the semiconductor substrate. The filling layer of the second material is formed substantially only in the hole.

In this semiconductor device, a hole is formed in the first insulating layer. This hole is provided surrounding the device forming region, and extending from the top surface of the insulating layer toward the main surface of the semiconductor substrate. The hole is filled with the filling layer formed of the second material. Therefore, the filling layer is provided surrounding the device forming region. Consequently, when a portion covered by the insulating layer other than the device forming region is cut, the way of the crack generated by cutting is obstructed by the filling layer. Thus, the crack can not reach the device forming region, and accordingly, short-circuit between layers can be prevented, ensuring the reliability. In addition, the filling layer of the second material is formed substantially only in the hole. Namely, the filling layer is not formed on the insulating layer other than the device forming region. Therefore, when the insulating layer portion other than the device forming region is cut, what is cut is only the insulating layer. Therefore, long life of the blade of the dicer can be ensured.

Preferably, in the present invention, the hole includes a plurality of holes arranged spaced apart from each other to surround the device forming region.

Preferably, the hole includes a trench extended to surround the device forming region.

Further, the first material preferably includes a silicon oxide.

Preferably, the device includes a field effect transistor.

The above described object of the present invention is attained by the method of manufacturing the semiconductor device in accordance with the present invention, in which a device forming region including a device formed on the main surface of a semiconductor substrate is formed; an insulating layer of a first material is formed to cover the device forming region; a hole is formed in the insulating layer to surround the device forming region and to extend from the top surface of the insulating layer toward the main surface of the semiconductor substrate; and a filling layer formed of a second material is formed substantially only in the hole.

In the present invention, preferably, the step of forming the filling layer includes the step of filling the hole and to form an upper layer to cover the top surface of the insulating layer, and the step of removing the upper layer so as to expose the top surface of the insulating layer.

The above described object of the present invention is attained by the semiconductor device of the present invention including a semiconductor substrate, a device forming region, a conductive region, an insulating layer, a first filling layer formed of a conductive material, and a second filling layer formed of a conductive material. The semiconductor substrate has a main surface. The device forming region includes a device formed on the main surface of the semiconductor substrate. The conductive region is formed on the main surface of the semiconductor substrate in the device forming region. The insulating layer is formed to cover the device forming region. The insulating layer has a first hole provided to surround the device forming region and extending from the top surface of the insulating layer toward the main surface of the semiconductor substrate. The insulating layer further includes a second hole extending from the surface of the insulating layer and reaching the conductive region in the device forming region. The first filling layer formed of a conductive material is formed substantially only in the first hole. The second filling layer formed of a conductive material is formed substantially only in the second hole.

In the semiconductor device, the first filling layer of a conductive material is formed substantially only in the first hole. Namely, the first filling layer of the conductive material is not formed on the insulating layer except in the device forming region. Therefore, when the insulating layer outside the device forming region is cut, the first filling layer of the conductive material is not cut, and the first filling layer of the conductive material is not scattered. Therefore, the first filling layer of the conductive material never bridges the bonding pads, and thus short-circuit between bonding pads can be prevented.

In the present invention, preferably, the device includes a field effect transistor, and the conductive region includes an impurity region of the field effect transistor formed on the main surface of the semiconductor substrate.

Preferably, an interconnection layer formed on the insulating layer is further included, and the second filling layer electrically connects the impurity region to the interconnection layer.

Further, the second filling layer preferably includes a barrier metal layer formed to be in contact with the surface of the impurity region.

Preferably, the conductive material forming the first and second filling layers include tungsten.

The above described objects of the present invention can be attained by the method of manufacturing the semiconductor device in accordance with the present invention in which a device forming region including a device formed on a main surface of a semiconductor substrate is formed; a conductive region is formed on the main surface of the semiconductor substrate in the device forming region; an insulating layer is formed to cover the device forming region; a first hole is formed in the insulating layer to surround the device forming region and to extend from the top surface of the insulating layer toward the main surface of the semiconductor substrate; a second hole is formed insulating layer extending from the top surface of the insulating layer and reaching the conductive region in the device forming region; a first filling layer formed of a conductive material is formed substantially only in the first hole, and a second filling layer of a conductive material is formed substantially only in the second hole.

By this method of manufacturing the semiconductor device, a first filling layer of a conductive material is formed substantially only in the first hole, and a second filling layer of a conductive material is formed substantially only in the second hole. A conductive material is used for the first filling layer filling the first hole, since it must be electrically connected to the conductive region. The second filling layer filling the second hole is not formed on the insulating layer outside the device forming region. Therefore, short-circuit between bonding pads caused by the scattering of the second filling layer at the time of cutting can be prevented. Therefore, it becomes possible to use a conductive material as the second filling layer. Namely, the same conductive material can be used for the first and second filling layers. Therefore, the first hole and the second hole can be respectively filled with the first and second filling layers in the same step. This simplifies the manufacturing process.

In the present invention, preferably, the step of forming the first and second filling layers includes the step of forming a conductive layer to fill the first and second holes and to cover the top surface of the insulating layer, and the step of removing the conductive layer such that the top surface of the insulating layer is exposed.

The above described objects of the present invention can be attained by the method of manufacturing the semiconductor device in accordance with the present invention in which a device forming region including a device formed on the main surface of a semiconductor substrate is formed; a conductive region is formed on the main surface of the semiconductor substrate in the device forming region; an insulating layer is formed to cover the device forming region; a first hole is formed in the insulating layer to surround the device forming region and to extend from the top surface of the insulating layer toward the main surface of the semiconductor substrate; a second layer is formed in the insulating layer extending from the top surface of the insulating layer to reach the conductive region in the device forming region; a first filling layer of a conductive material is formed to fill the first hole and to have a top surface continuous to the top surface of the insulating layer, and a second filling layer of a conductive material is formed to fill the second hole and to have a top surface continuous to the top surface of the insulating layer; and by cutting the insulating layer and the semiconductor substrate at the region surrounding the filling layer, the semiconductor devices including the device forming region are separated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
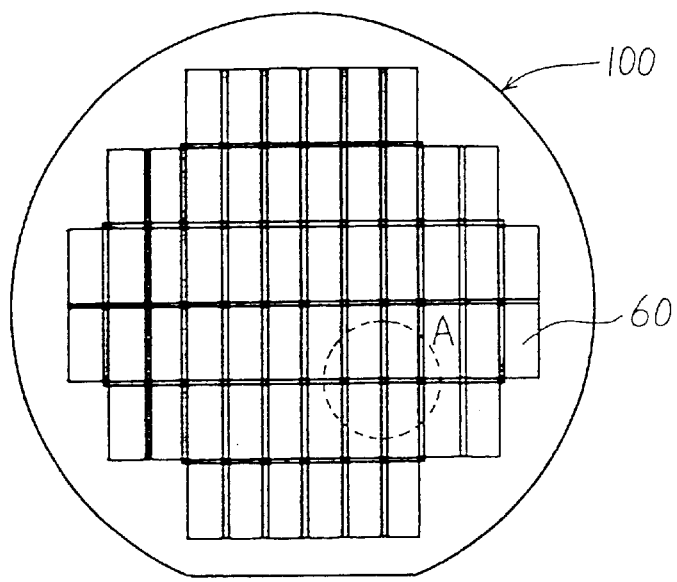
FIG. 1 is a plan view showing schematically a wafer in accordance with one embodiment of the present invention.
Figure 2:
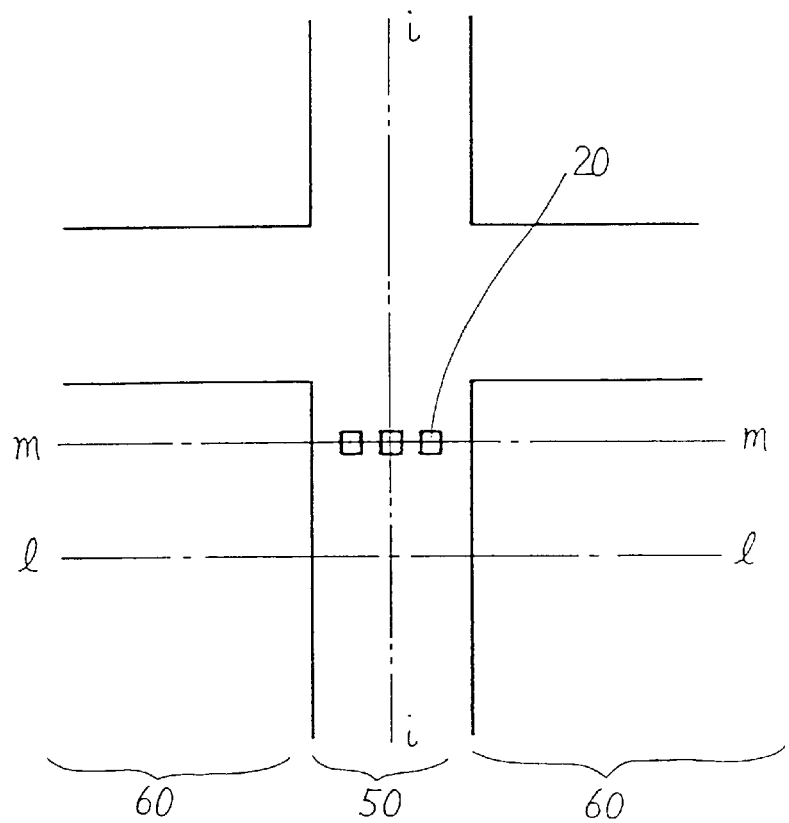
FIG. 2 is an enlarged plan view showing the portion A of FIG. 1.

Referring to FIGS. 1 and 2, a plurality of devices 60 are formed on a wafer 100. The devices 60 are manufactured through etchback tungsten plug process. There are dicing line portions 50 on which devices are not formed, between each of the devices. Alignment marks 20 are formed at the dicing line portion 50. The dicing line portion 50 is a region which is cut when the wafer is divided into chips, and it is cut along the line i—i, for example.

Figure 3:
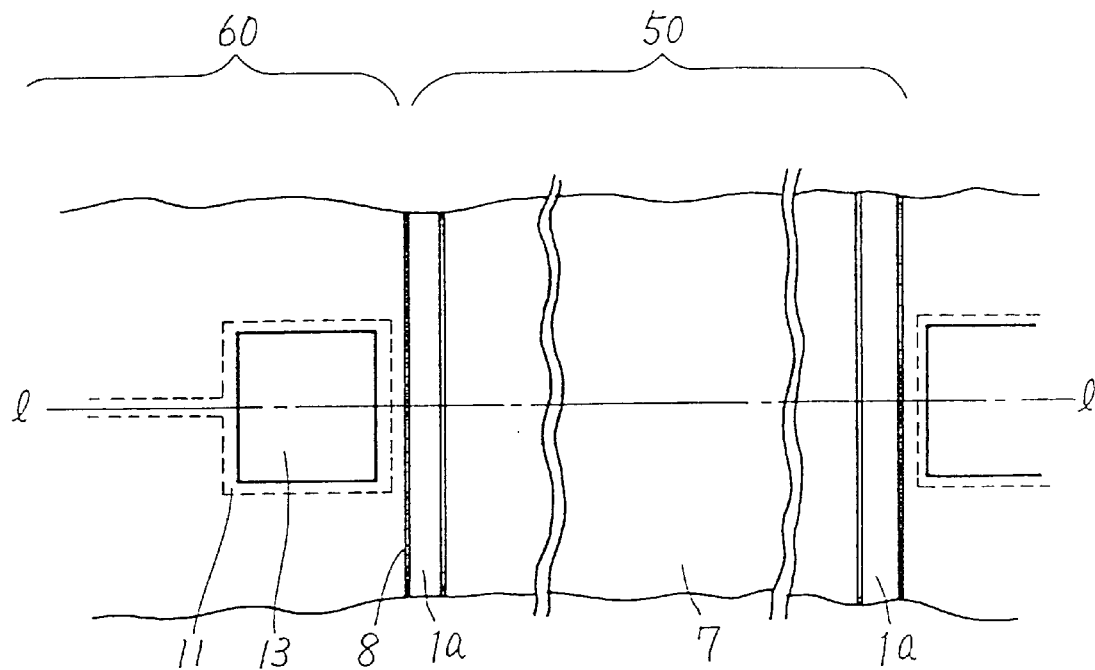
FIG. 3 is a plan view showing, in enlargement, a portion along the line 1—1 of FIG. 2.
Figure 4:
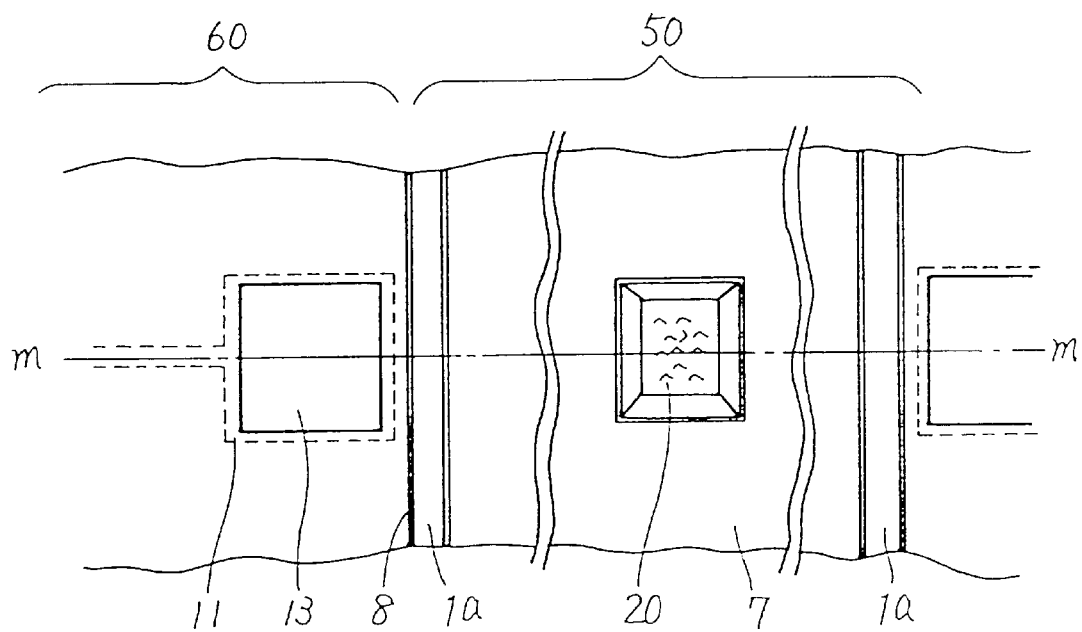
FIG. 4 is a plan view showing, in enlargement, a portion along the line m—m of FIG. 2.

Referring to FIGS. 3 and 4, a portion 1a filled with tungsten is formed to surround the device forming region 60, at the dicing line portion 50. For convenience, the portion 1a filled with tungsten will be referred to as a tungsten street. At dicing line portion 50, insulating film 7 is left on the semiconductor substrate. Therefore, the alignment mark 20 formed at dicing portion 50 is a depressed type mark.

A cross sectional structure of the semiconductor device in accordance with the first embodiment will be described.

Figure 5:
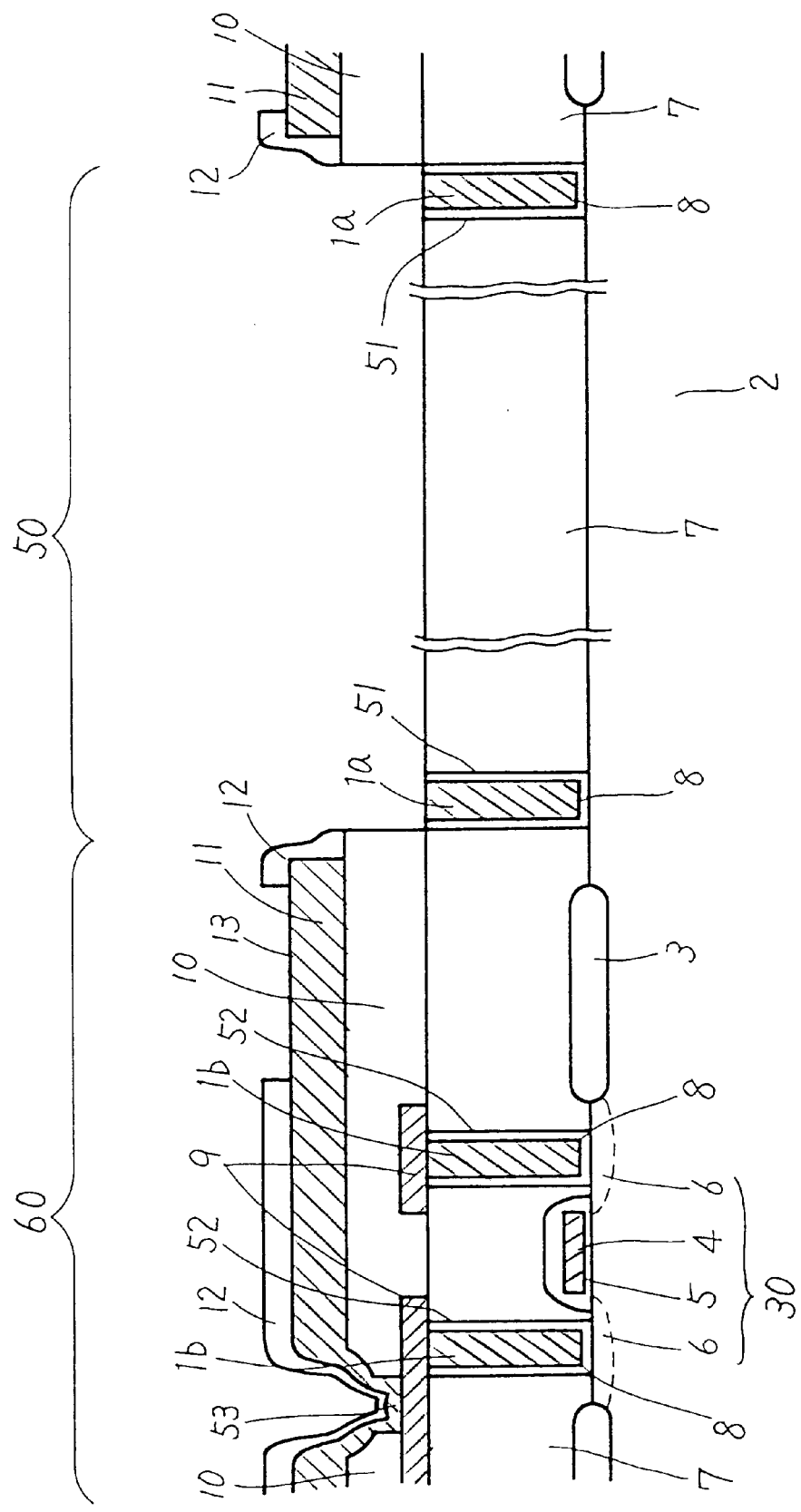
FIG. 5 is a cross section taken along the line 1—1 of FIG. 3.

Referring to FIG. 5, this is a cross section of a portion where the alignment mark is not provided at the dicing line portion 50. This cross section shows the wafer before dicing into chips, and dicing line portion 50 exists between device forming regions 60. First, referring to the device forming region 60, an oxide film 3 for isolating elements is formed on a surface of the semiconductor substrate 2. Between the oxide films 3, a MOS transistor 30 is formed. The MOS transistor 30 includes a gate electrode 4, a gate oxide film 5 and an impurity diffused region 6. On the surface of the semiconductor substrate on which MOS transistor 30 has been formed, an insulating layer 7 is formed. Insulating layer 7 includes a contact hole 52 formed above impurity diffused region 6. A portion of the surface of impurity diffused region 6 is exposed through contact hole 52. A barrier metal 8 of TiN/Ti is formed thin on the sidewalls and on the bottom surface of contact hole 52. Contact hole 52 is filled with a tungsten plug 1b. A first aluminum interconnection layer 9 is formed on contact hole 52. First aluminum interconnection layer 9 is electrically connected to impurity diffused region 6 through tungsten plug 1b. An interlayer insulating film 10 is formed on the surface of insulating layer 7. Interlayer insulating film 10 has a through hole 53 formed above the first aluminum interconnection layer 9. A portion of the surface of first aluminum interconnection layer 9 is exposed through through hole 53. A second aluminum interconnection layer 11 is formed on the surface of interlayer insulating film 10. Aluminum interconnection layer 11 is electrically connected to first aluminum interconnection layer 9 through through hole 53. A passivation film 12 is formed on the surface of the second aluminum interconnection layer 11. Passivation film 12 has an opening. A portion of the surface of the second aluminum interconnection layer is exposed through the opening. The exposed portion of the second aluminum interconnection layer 11 serves as the bonding pad portion 13. Referring to the dicing line portion 52, insulating layer 7 is formed on the surface of semiconductor substrate 2. Insulating layer 7 has a trench portion 51 surrounding the device forming region 60. A barrier metal 8 of TiN/Ti is formed thin on the inner wall of the trench 51. Trench portion 51 is filled with tungsten street 1a. Tungsten street 1a is formed to surround the device forming region 60.

Figure 6:
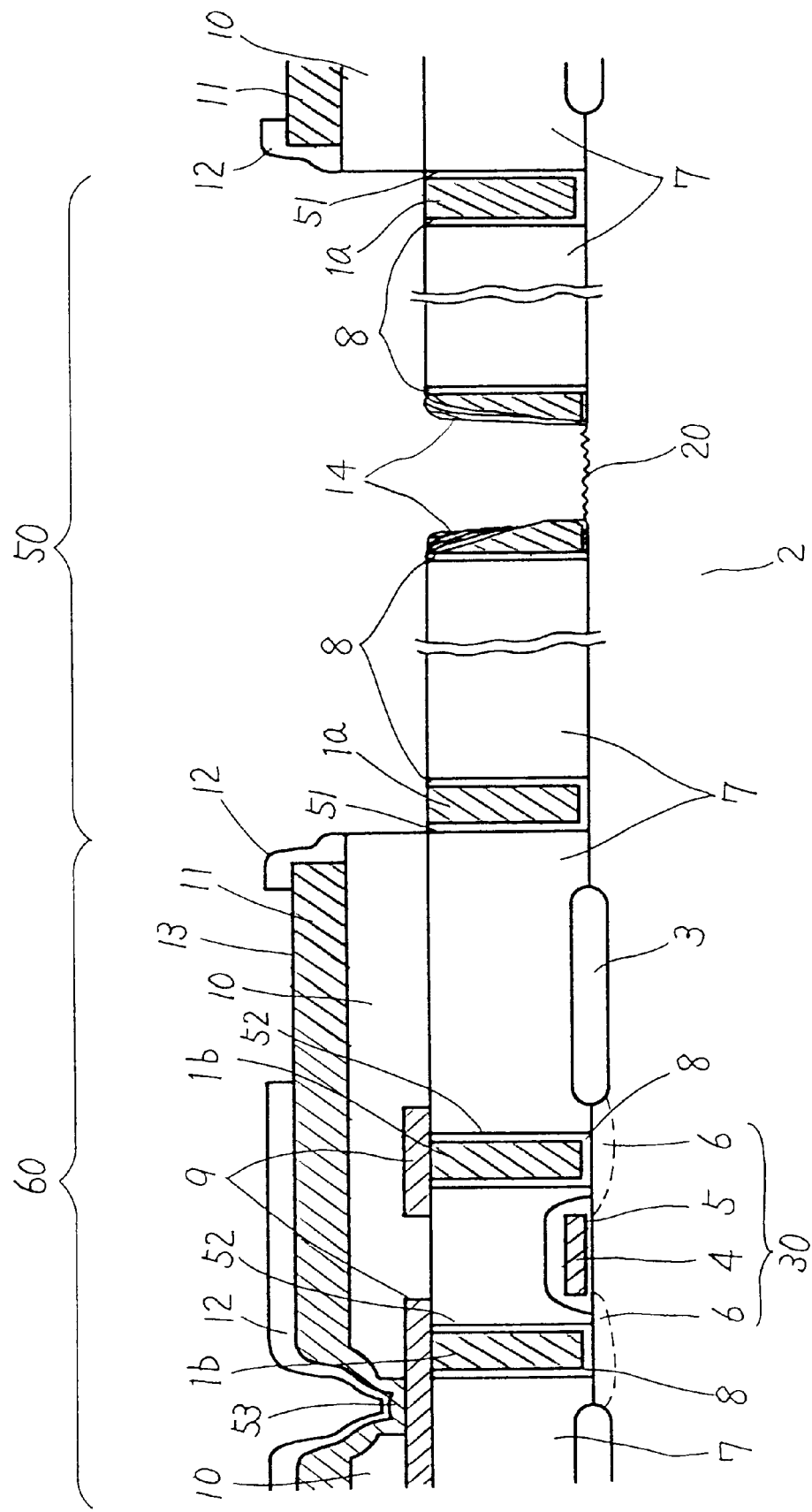
FIG. 6 is a cross section taken along the line m—m of FIG. 4.

FIG. 6 is a cross section of a portion where an alignment mark is provided at dicing line portion 50. The device forming region 60 has the same structure as the portion having no alignment mark shown in FIG. 5. There are a plurality of depressed type alignment marks 20 formed at dicing line portion 50. Residue 14 is left on the sidewalls of the alignment mark. Except this point, the structure is the same as FIG. 5. In FIGS. 5 and 6, the dicing line portion 50 is omitted for simplicity.

The semiconductor device in accordance with the first embodiment of the present invention is structured as described above. The method of manufacturing the semiconductor device will be described in the following.

Figure 7:
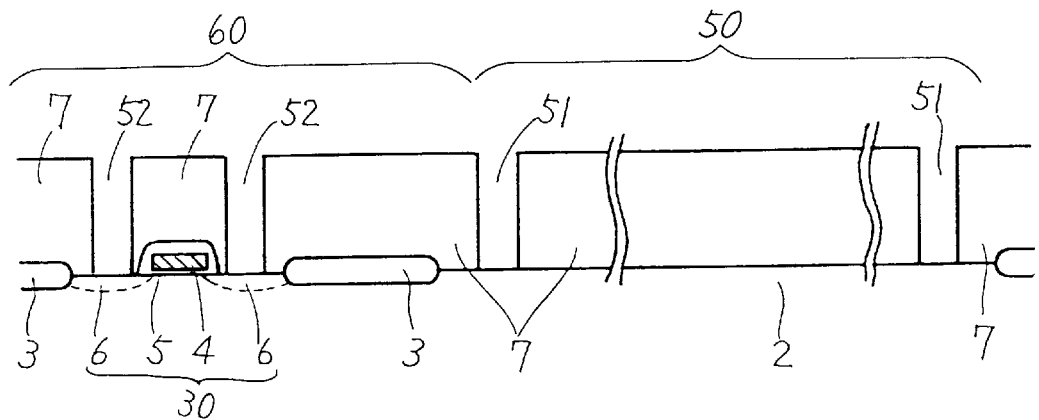
FIGS. 7 to 14 are cross sections taken along the line 1—1 of FIG. 3 showing, in order, the steps of manufacturing the semiconductor device in accordance with the first embodiment of the present invention.
Figure 15:
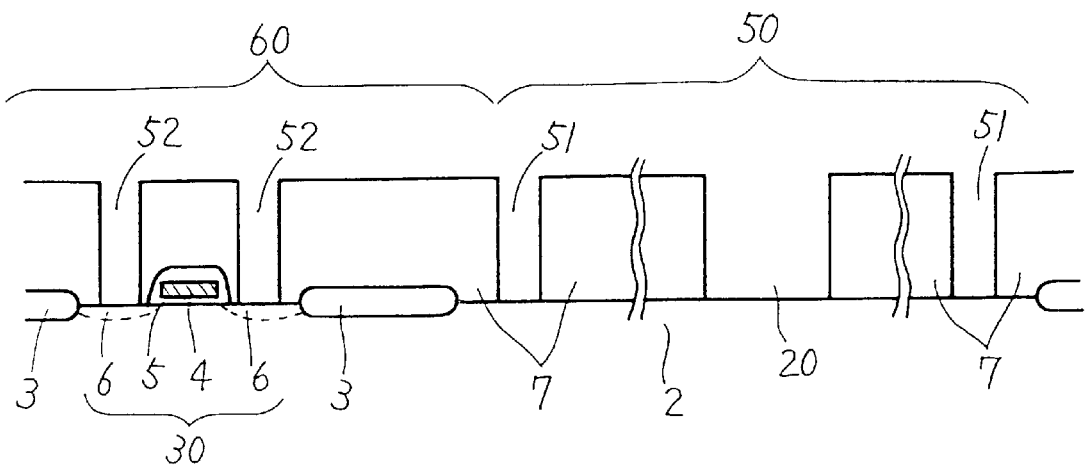
FIGS. 15 to 22 are cross sections taken along the line m—m of FIG. 3 showing, in order, the steps of manufacturing the semiconductor device in accordance with the first embodiment of the present invention.

Referring to FIGS. 7 and 15, an oxide film 3 for isolating elements is formed on the surface of semiconductor substrate 2. An MOS transistor 30 including a gate electrode 4, a gate oxide film 5 and an impurity diffused region 6 is formed between oxide films 3. An insulating layer 7 is formed on the surface of semiconductor substrate 2. In the device forming region 60, an opening 52 is formed in insulating layer 7. The opening 52 is formed on impurity diffused region 6, and a portion of the surface of impurity diffused region 6 is exposed through the opening 52. At dicing line portion 50, a trench 51 is formed in insulating layer 7. The trench portion 51 is formed to surround the device forming region 60, and a portion of the surface of semiconductor substrate 2 is exposed through the trench 51. Referring particularly to FIG. 15, a depressed type alignment mark 20 is formed in insulating layer 7.

Figure 8:
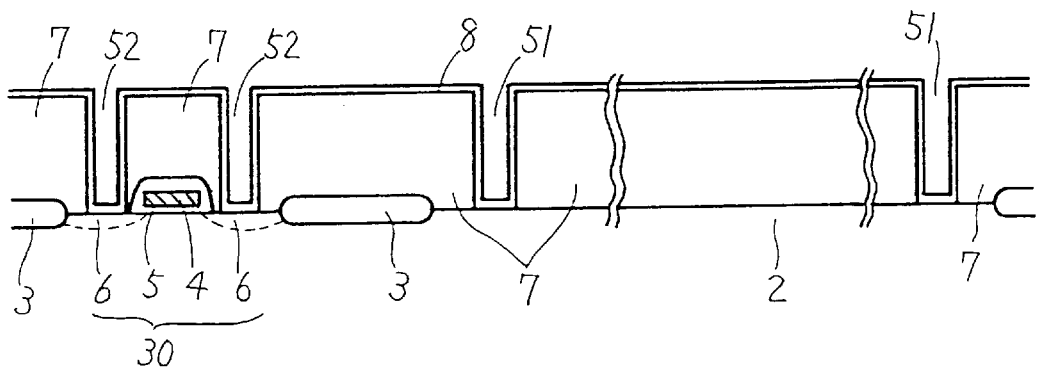
Figure 16:
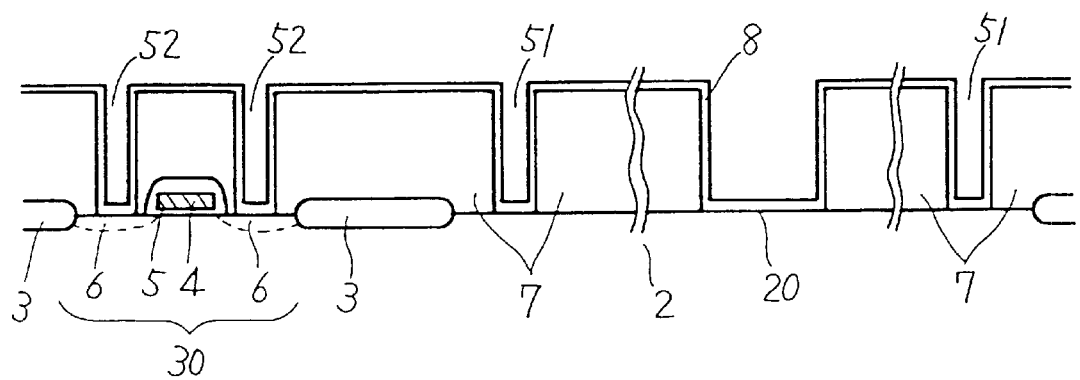

Referring to FIGS. 8 and 16, a barrier metal 8 formed of TiN/Ti is formed thin on the entire wafer.

Figure 9:
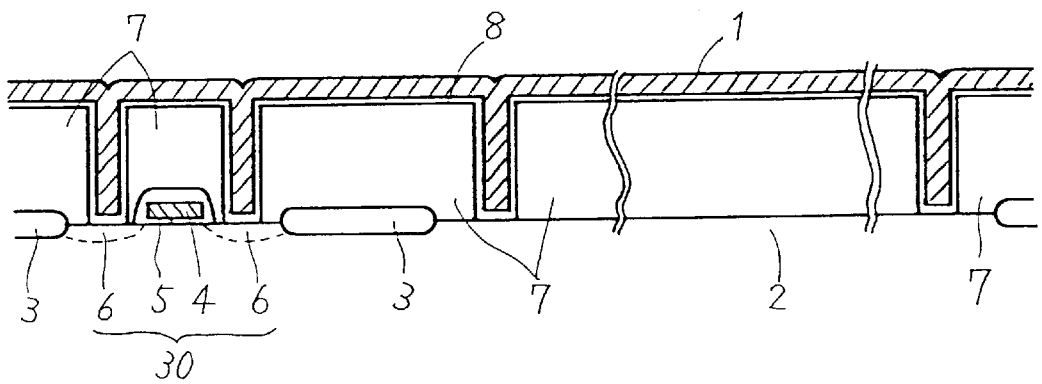
Figure 10:
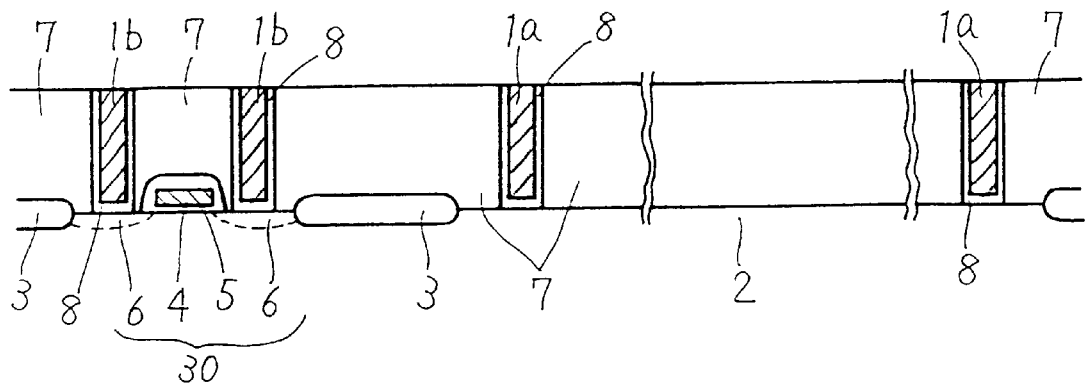
Figure 17:
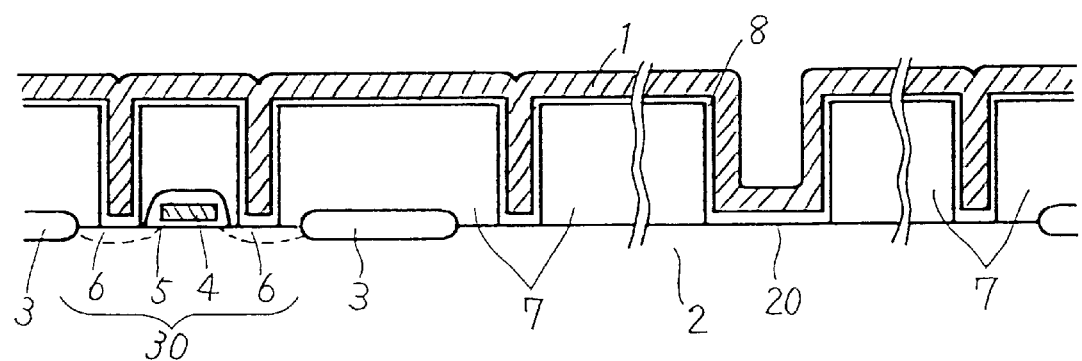

Referring to FIGS. 9 and 17, a tungsten layer 1 is deposited by CVD method on the entire wafer on which barrier metal 8 has been formed. By the deposition of tungsten layer 1, opening 52 and trench portion 51 are filled with tungsten layer 1.

Figure 18:
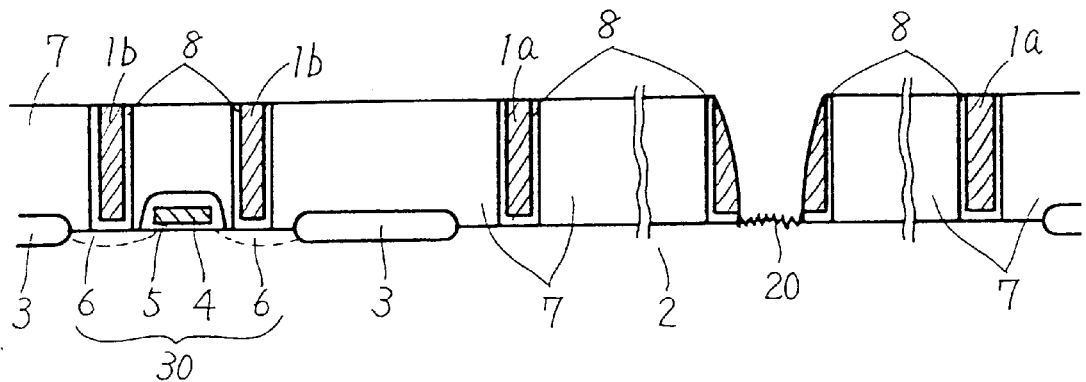

Referring to FIGS. 10 and 18 and 7 and 15, the entire surface on which tungsten layer 1 is deposited is etched back. By this etchback, tungsten plug 1b is formed in the opening 52 of device forming region 60. Tungsten street 1a is formed in trench portion 51 surrounding the device forming region 60 at dicing line portion 50. Tungsten plug 1b is electrically connected to impurity diffused region 6. Referring especially to FIG. 18, by the etchback of tungsten layer 1, that portion of the surface of the semiconductor substrate 2 which is exposed through the depressed alignment mark 20 is made rough.

Figure 11:
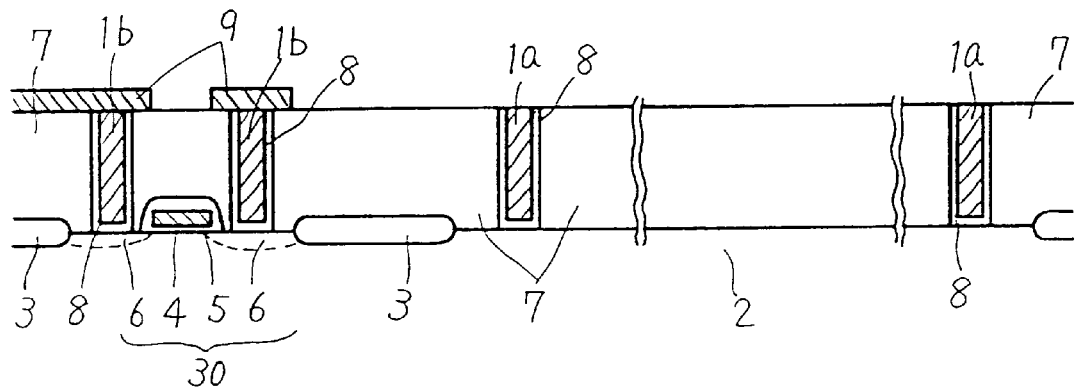
Figure 19:
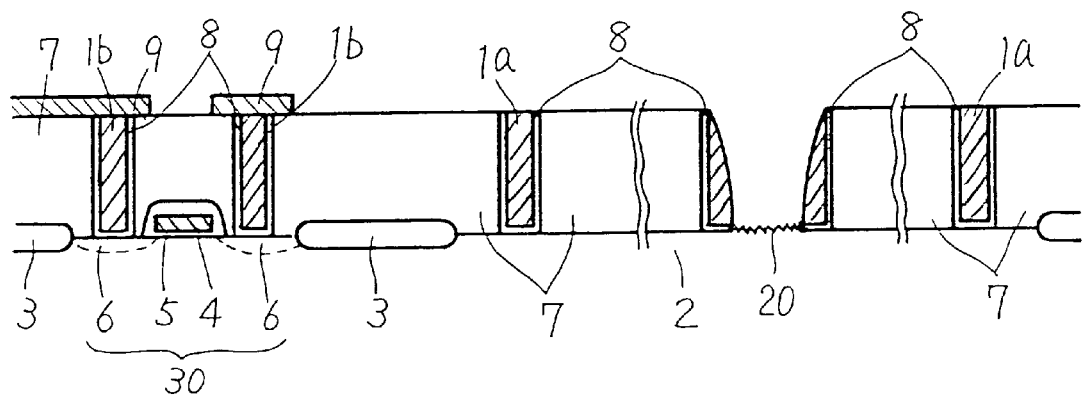

Referring to FIGS. 11 and 19, a first aluminum layer is formed on the entire surface of insulating layer 7. The aluminum layer is etched and a first aluminum interconnection layer 9 is formed. The first aluminum interconnection layer 9 is left only on tungsten plug 1b.

Figure 12:
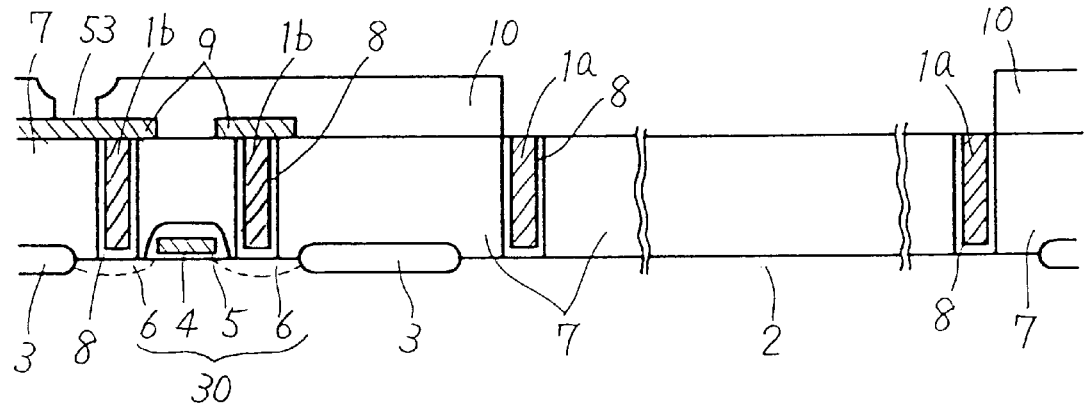
Figure 20:
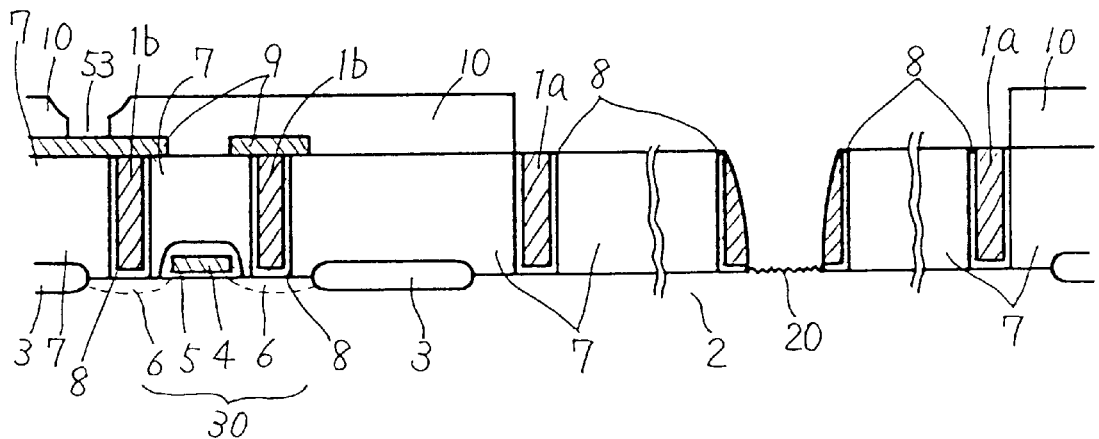

Referring to FIGS. 12 and 20, an insulating layer is formed on the entire surface of semiconductor substrate 2. The insulating layer is etched and an interlayer insulating film 10 is formed. The interlayer insulating film 10 is left on the surface of insulating layer 7 only in device region 60. Interlayer insulating film 10 on a portion of the surface of the first aluminum interconnection layer 9 is also removed by etching. Consequently, a through hole 53 is formed in interlayer insulating film 10, through which a portion of the surface of the first aluminum interconnection layer 9 is exposed.

Figure 13:
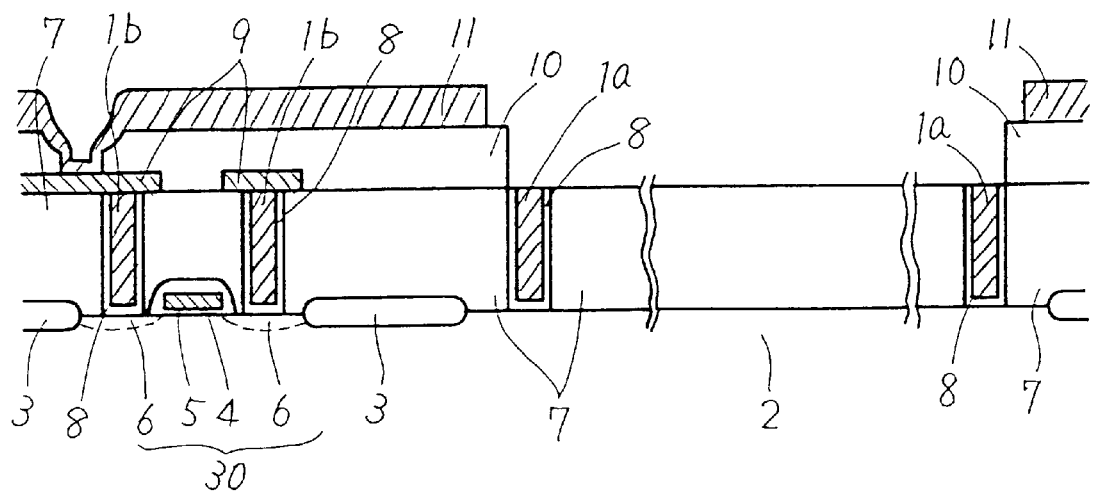
Figure 21:
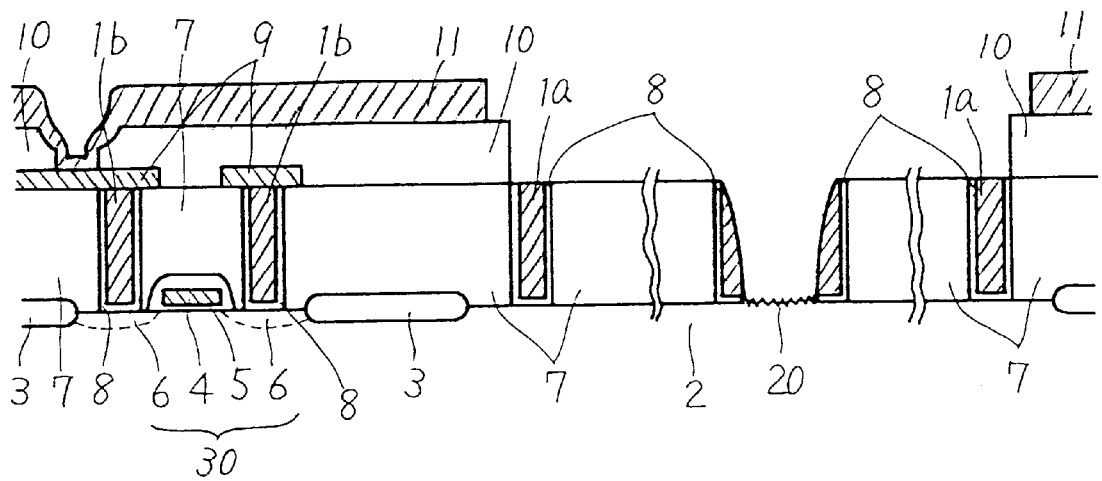

Referring to FIGS. 13 and 21, a second aluminum layer is formed on the entire surface of interlayer insulating film 10. The second aluminum layer is etched and a second aluminum interconnection layer 11 is formed. The second aluminum interconnection layer 11 is left only on the surface of interlayer insulating film 10. The second aluminum interconnection layer 11 is in contact with a portion of the surface of the first aluminum interconnection layer 9 through the through hole 53 of interlayer insulating film 10.

Figure 14:
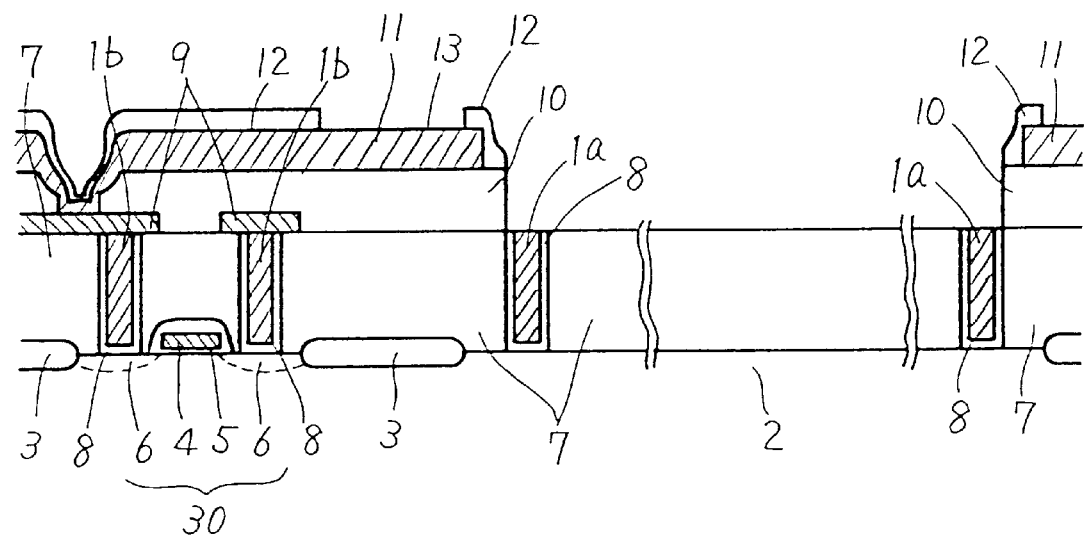
Figure 22:
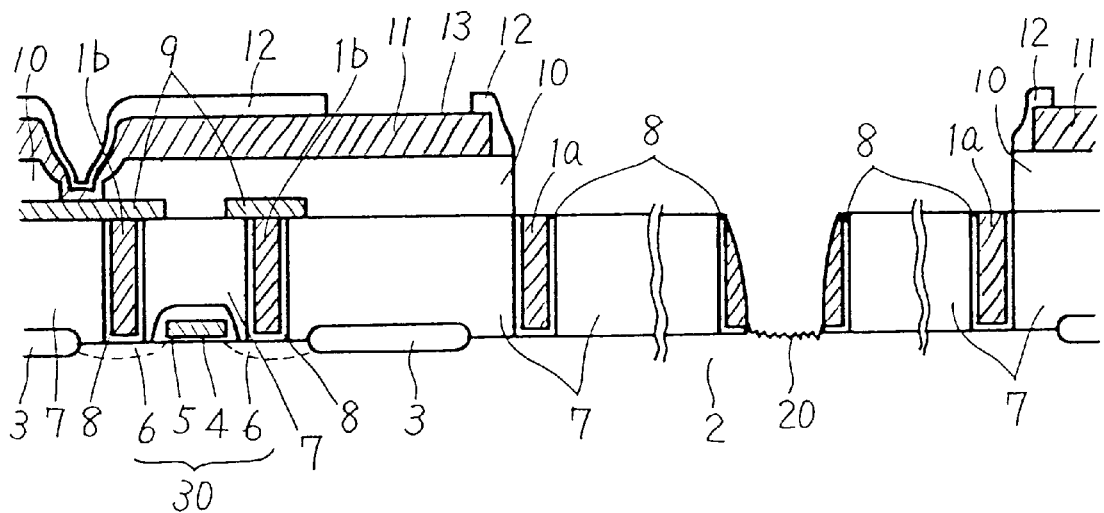

Referring to FIGS. 14 and 22, a passivation layer is deposited on the entire surface of interlayer insulating film 10. The passivation layer is etched and a passivation film 12 is formed. By this etching, the passivation film 12 is left to cover the second aluminum interconnection layer 11. The passivation film 12 on a portion of the surface of the second aluminum interconnection layer 11 is also removed by etching. Consequently, an opening is formed in passivation film 12, and a portion of the surface of the second aluminum interconnection layer 11 is exposed. The exposed portion of the second aluminum interconnection layer 11 serves as the bonding pad portion 13. In cross sections of portions having alignment marks 20, residue formed on the sidewalls of alignment mark 20 is omitted.

The semiconductor device in accordance with the first embodiment of the present invention is manufactured as described above.

In the semiconductor device in accordance with the first embodiment of the present invention, an insulating film 7 is left on the dicing line portion 50, where depressed type alignment marks are formed. Therefore, decrease in precision of alignment because of the surface roughness can be prevented. In addition, a tungsten street 1a is formed to surround the element forming region 60 in the insulating film layer 7 left at the dicing line portion 50. Therefore, when it is cut along the line i—i of FIG. 2, there are the following advantages.

Figure 23:
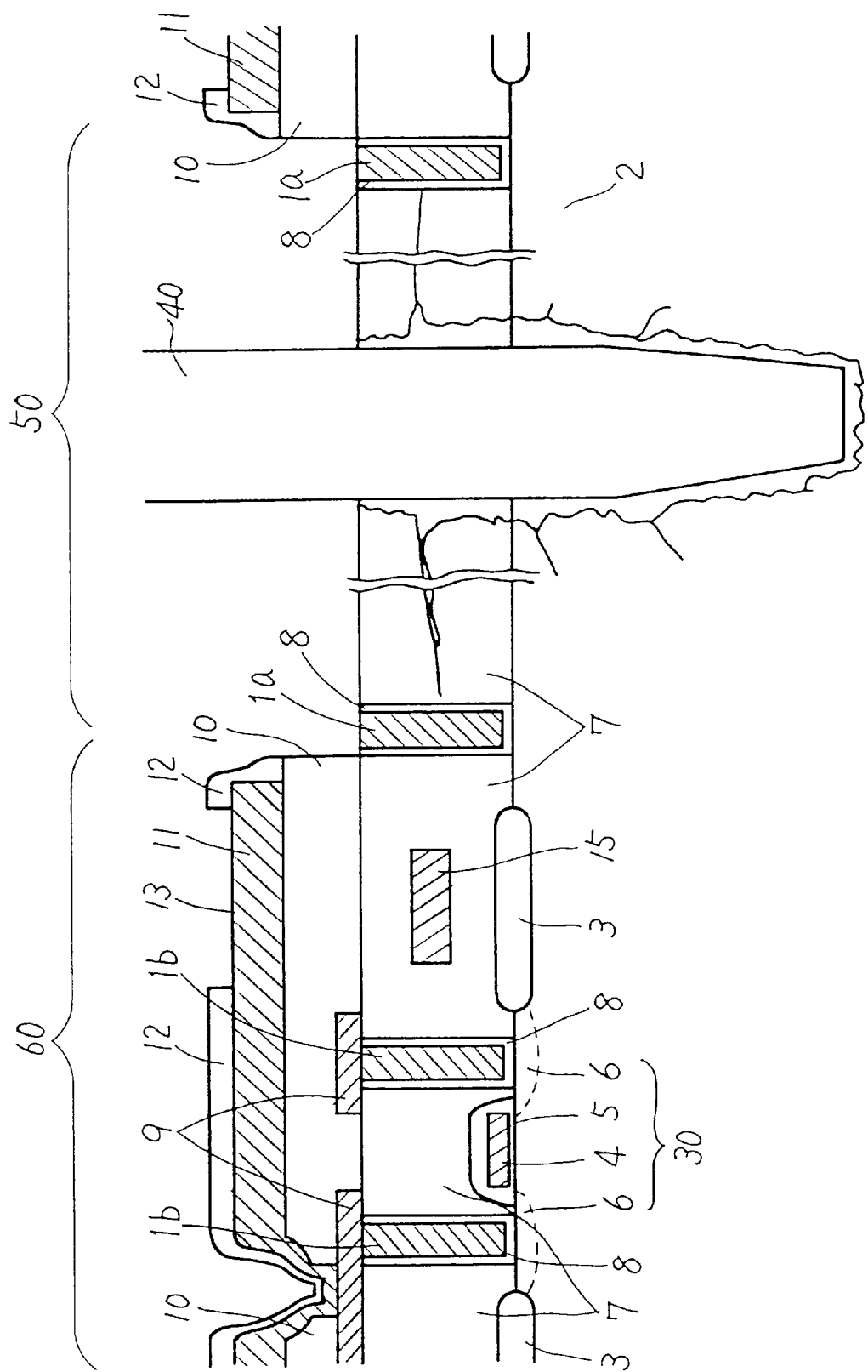
FIG. 23 is a cross section showing the manner of cutting the semiconductor device in accordance with the first embodiment of the present invention.

Referring to FIG. 23, when the dicing line portion 50 is cut by using a blade 40 of a dicer, cracks are generated from the cut portion and extend to the insulating layer 7 and the semiconductor substrate 2. The crack extends to the device forming region 60. However, since there is tungsten street 1a surrounding the device forming region 60, the cracks are stopped by the tungsten street 1a. Thus the cracks do not reach the device forming region 60, short-circuits between layers can be prevented, and reliability is ensured.

Further, different from the semiconductor device disclosed in the aforementioned prior art, there is no interconnection layer 9 formed on the insulating layer 7 at the dicing line portion. Therefore, short-circuits between bonding pads 13 caused by scattering of the interconnection layer 9 at dicing can be prevented.

Since only one layer, that is, the insulating layer, is left on the surface of the substrate, the blade 40 of the dicer has longer life, as compared with the case of cutting two layers including the insulating layer 7 and the interconnection layer 9.

Figure 24:
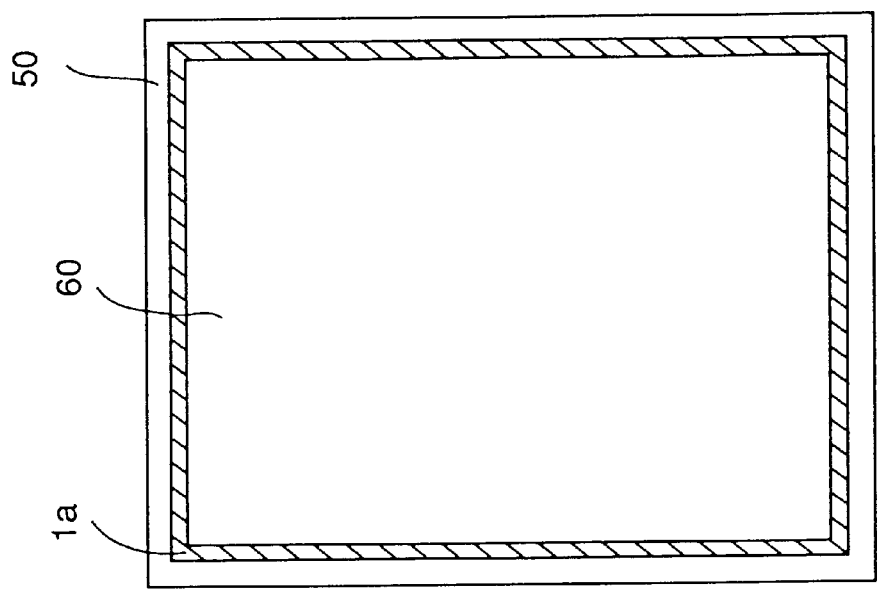
FIG. 24 includes a partial sectional view (a) and plan view (b) showing schematic structure after cutting of the semiconductor device in accordance with the first embodiment of the present invention.
Figure 24:
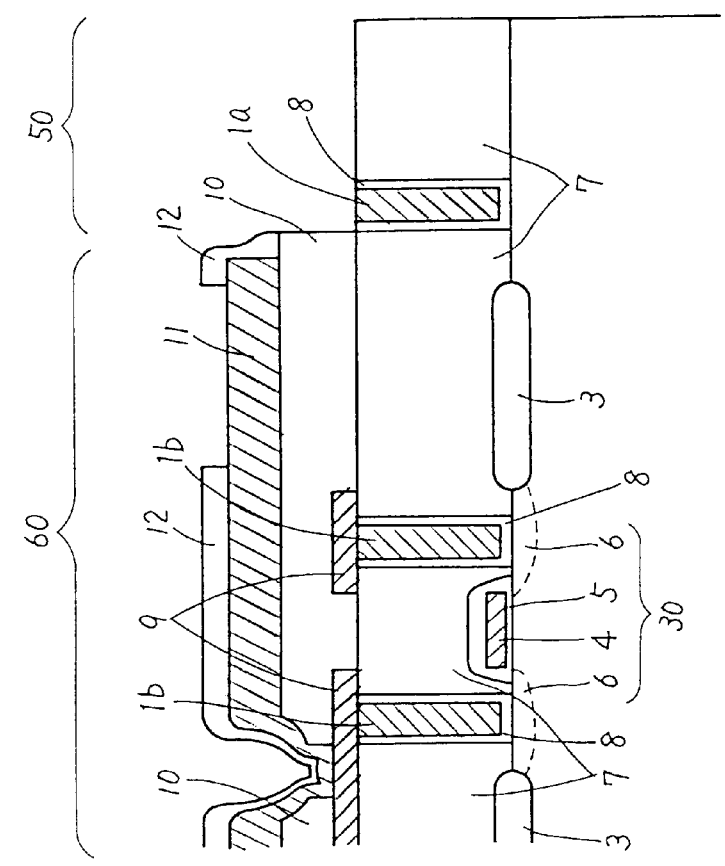

The structure of the semiconductor device after cutting will be described. Referring to FIG. 24(a), the insulating layer 7 of dicing line portion 50 is cut. Therefore, tungsten street 1a, barrier metal 8 and insulating layer 7 are left on the semiconductor substrate 2 in the dicing line portion 50 after cutting has such a structure. Referring to FIG. 24(b), after cutting, the tungsten street 1a surrounds the device forming region 60.

Figure 25:
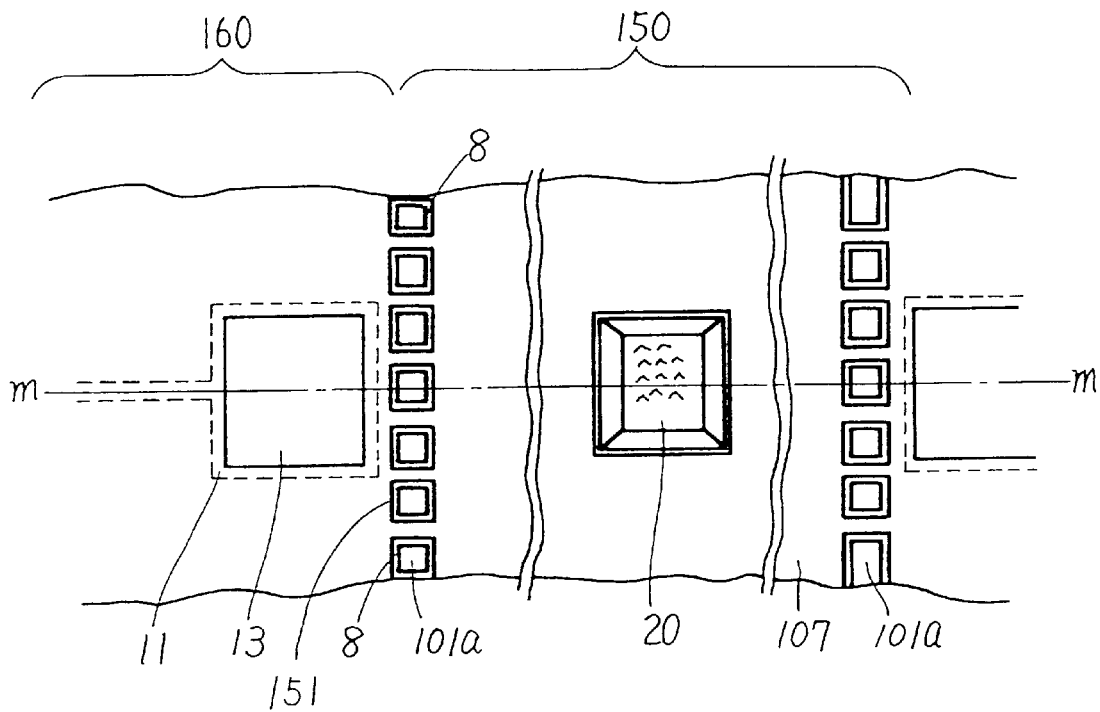
FIG. 25 is an enlarged plan view corresponding to the line m—m of FIG. 2 in accordance with a second embodiment of the present invention.
Figure 26:
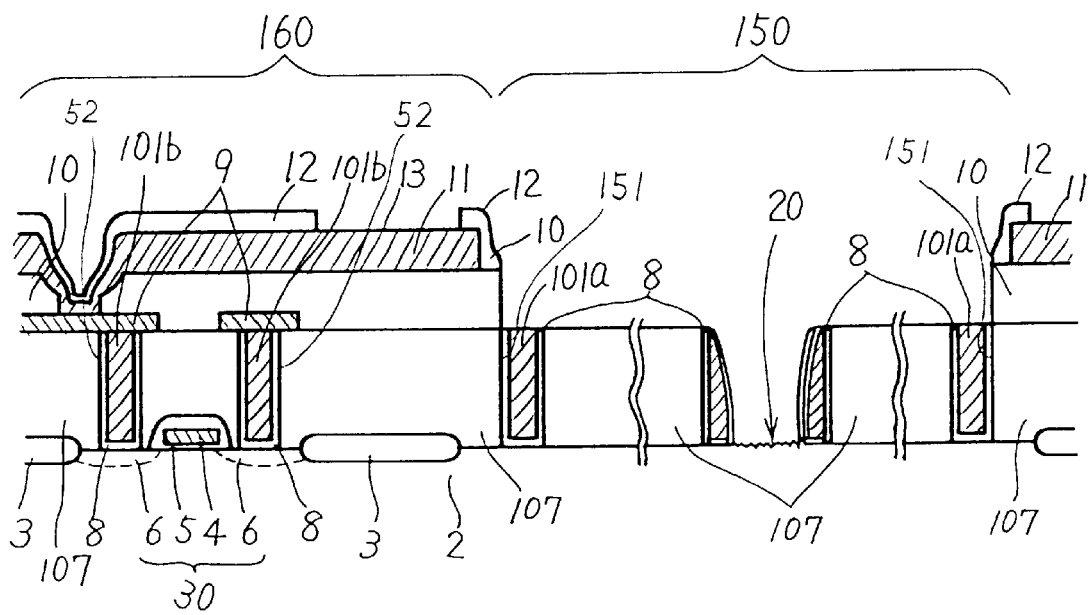
FIG. 26 is a cross section taken along the line m—m of FIG. 25.

A second embodiment of the present invention will be described in the following. Referring to FIGS. 25 and 26, a dicing line portion 150 is provided between device forming regions 160. The device forming region 160 has the same structure as the first embodiment. At the dicing line portion 150, an insulating layer 107 is left on the surface of the semiconductor substrate 2. A plurality of depressed type alignment marks 20 are formed on insulating layer 107. A plurality of hole-shaped apertures 151 are formed in the insulation layer 107 to surround the device forming region 60 insulation layer 107. The apertures 151 are filled with tungsten or the like. Portions corresponding to those in FIGS. 4 and 5 are denoted by the same or corresponding reference characters.

In the second embodiment, a tungsten street 101a including a number of holes surrounds the device forming region as mentioned above.

Although one tungsten street surrounds the device forming region in the above described two embodiments, two or more tungsten streets may be provided to surround the device forming region.

Figure 27:
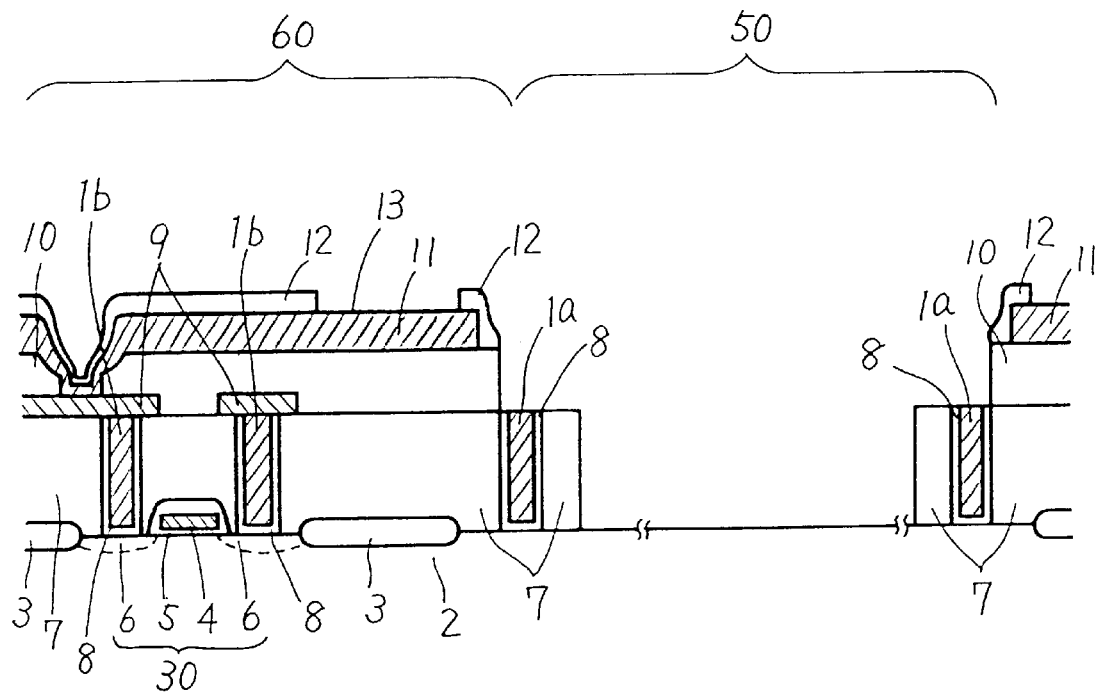
FIG. 27 is a cross section taken along the line 1—1 of FIG. 3 showing the ninth step of the method of manufacturing the semiconductor device in accordance with the first embodiment of the present invention.
Figure 28:
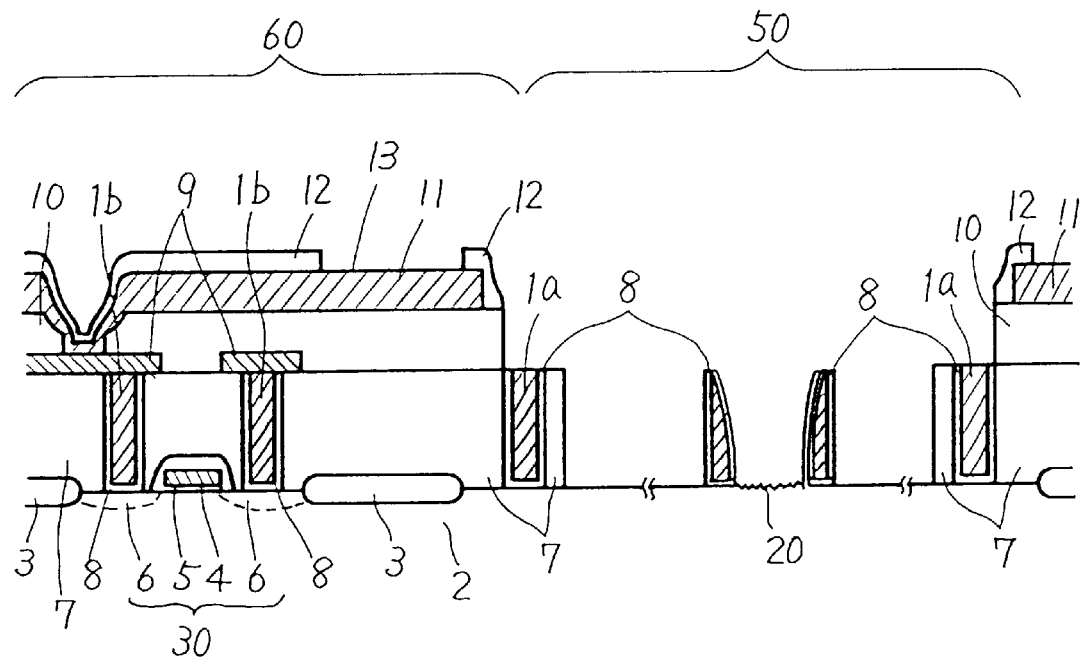
FIG. 28 is a cross section taken along the line m—m of FIG. 3 showing the ninth step of the method of manufacturing the semiconductor device in accordance with the first embodiment of the present invention.
Figure 29:
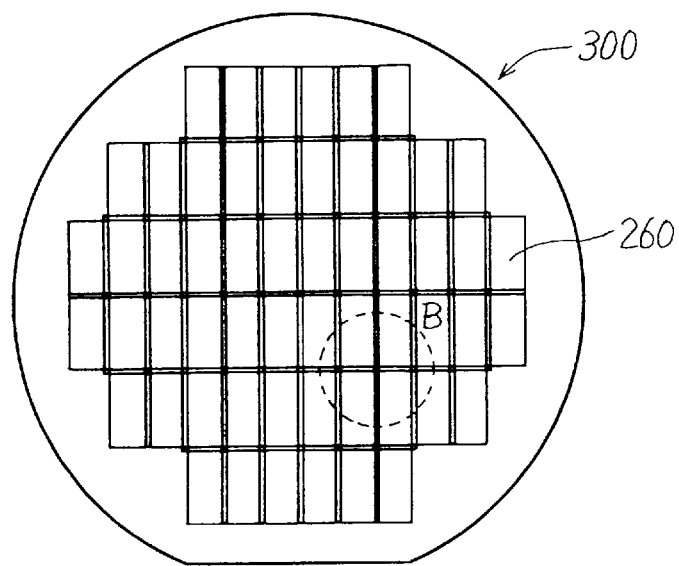
FIG. 29 is a plan view schematically showing a conventional wafer.
Figure 30:
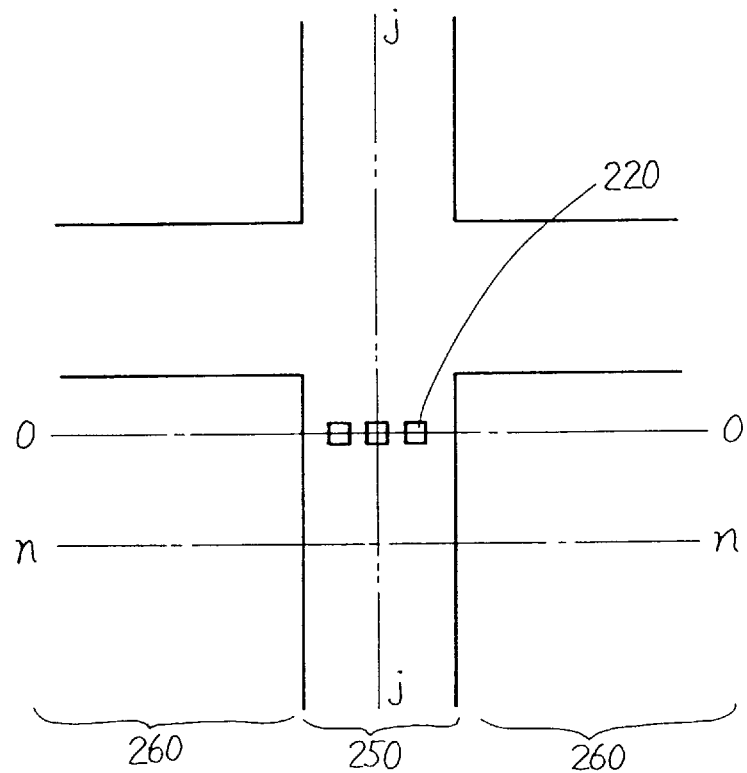
FIG. 30 is an enlarged plan view showing, in enlargement, the portion B of FIG. 29.
Figure 31:
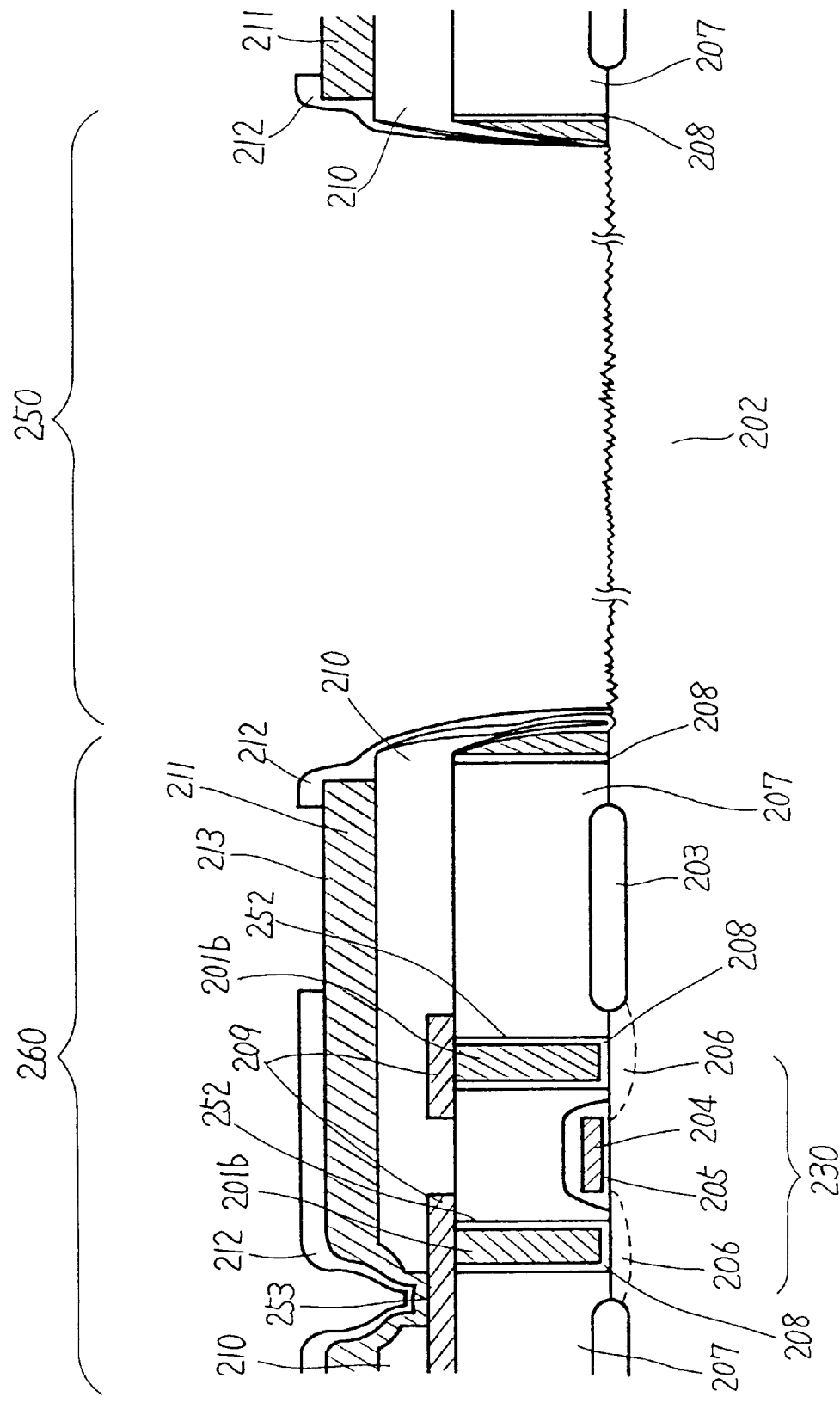
FIG. 31 is a cross section taken along the line n—n of FIG. 30.
Figure 32:
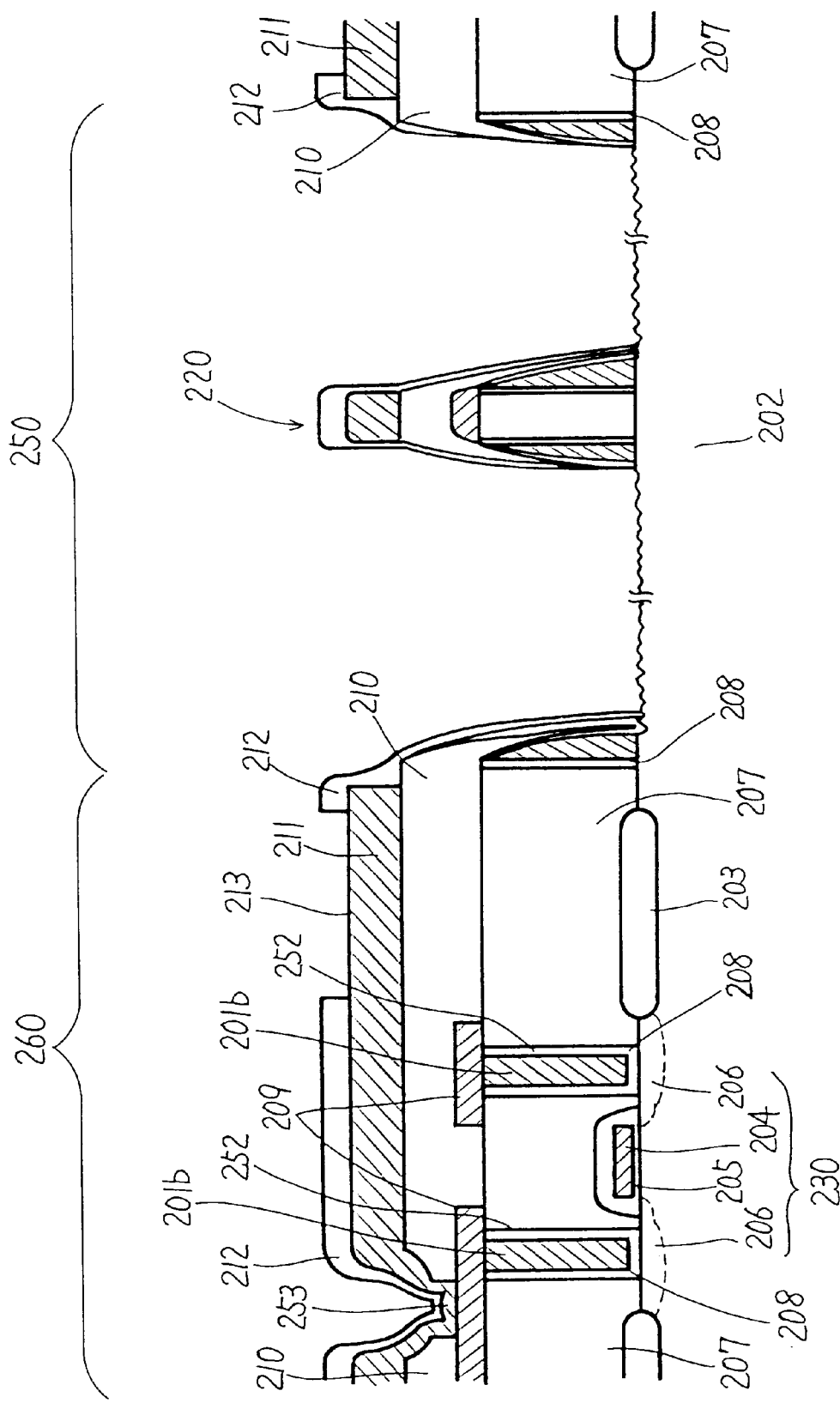
FIG. 32 is a cross section taken along the line o—o of FIG. 30.
Figure 33:
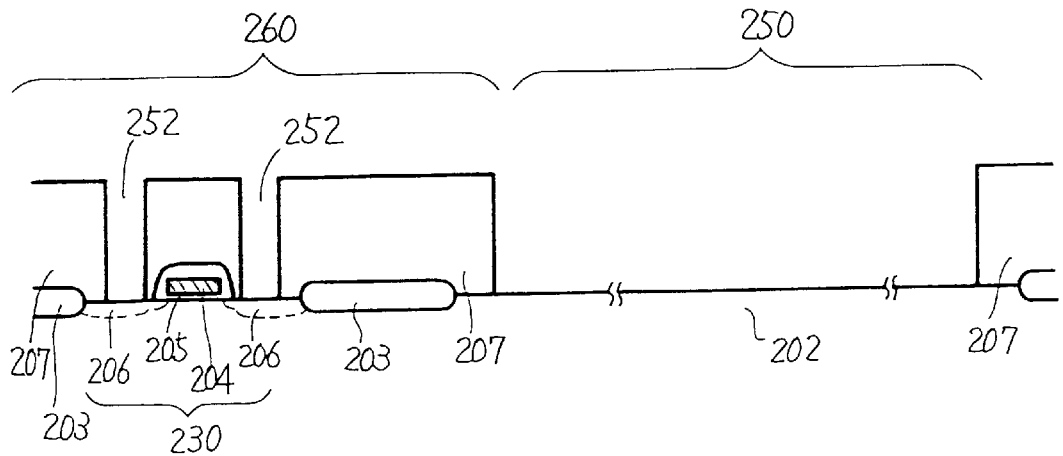
FIGS. 33 to 40 are cross sections taken along the line n—n of FIG. 30 showing, in order, the steps of manufacturing the conventional semiconductor device.
Figure 34:
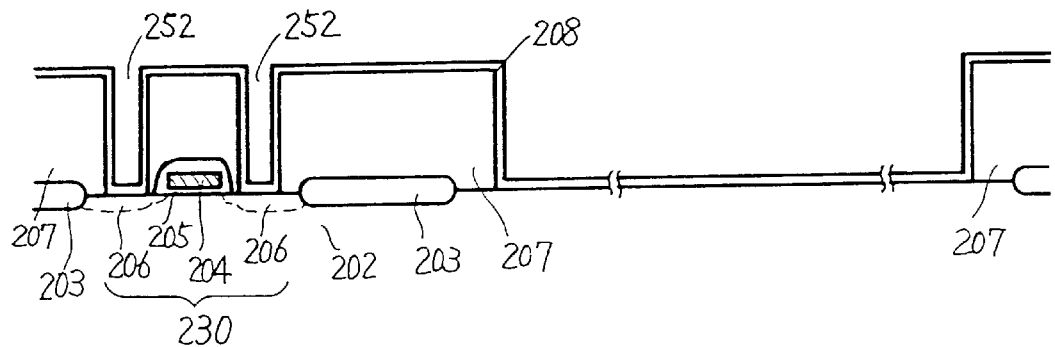
Figure 35:
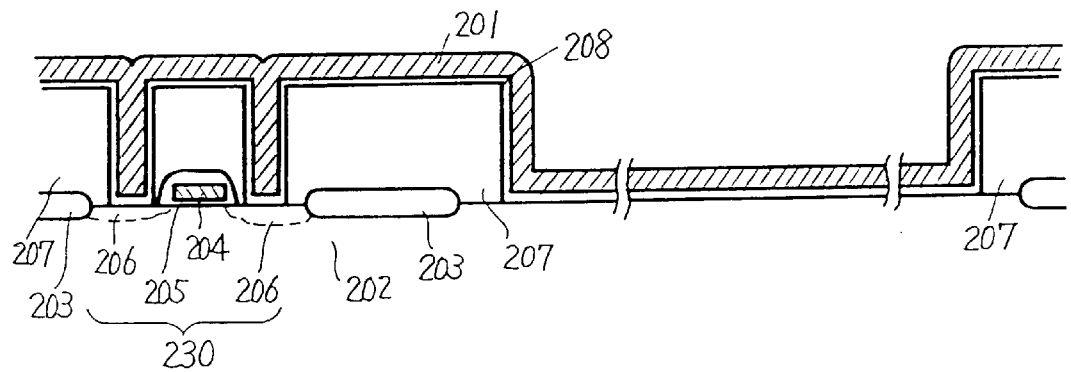
Figure 36:
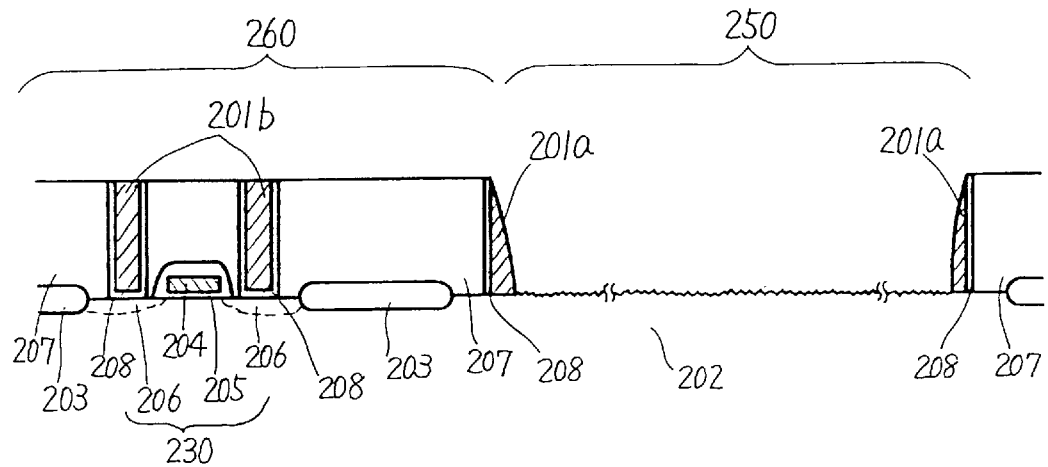
Figure 37:
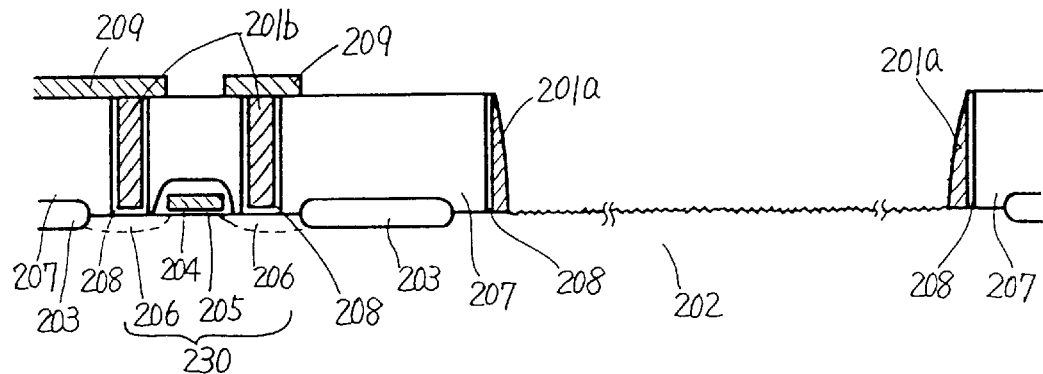
Figure 38:
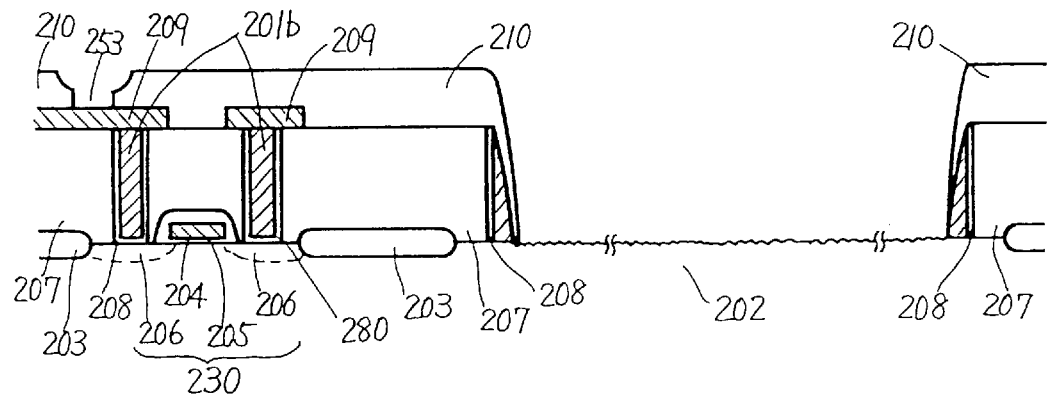
Figure 39:
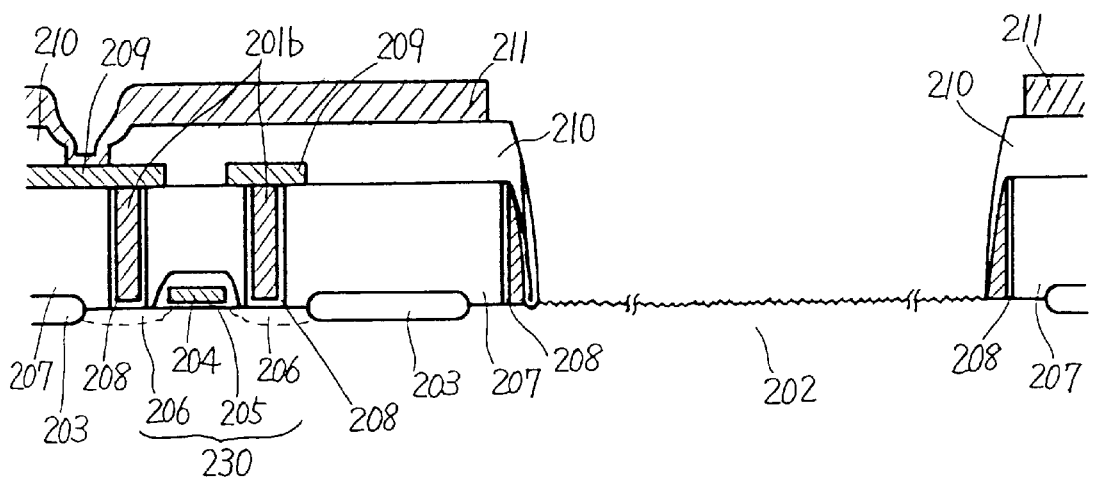
Figure 40:
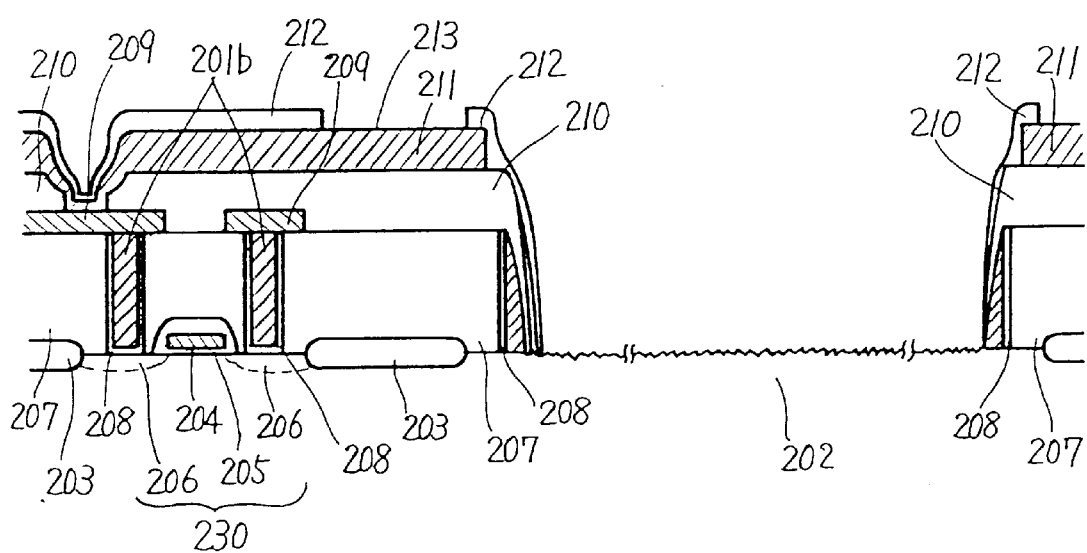
Figure 41:
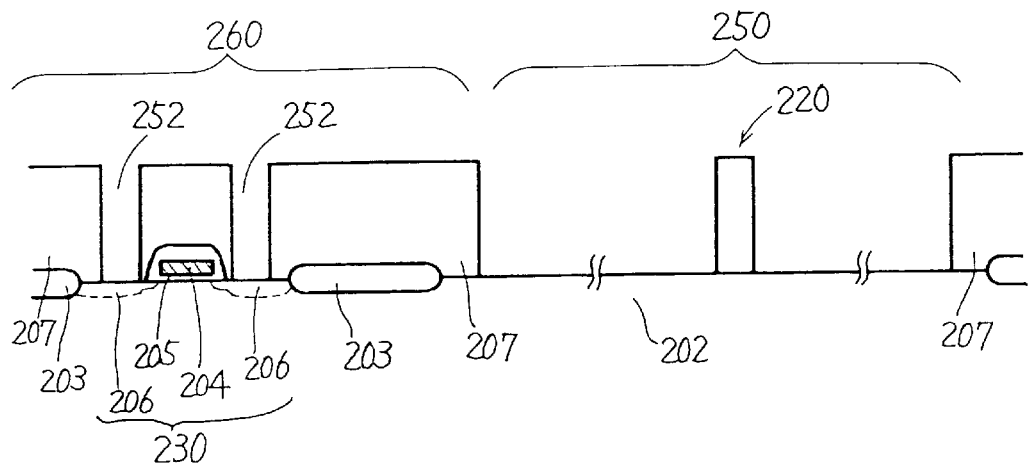
FIGS. 41 to 48 are cross sections taken along the line o—o of FIG. 30 showing, in order, the steps of manufacturing the conventional semiconductor device.
Figure 42:
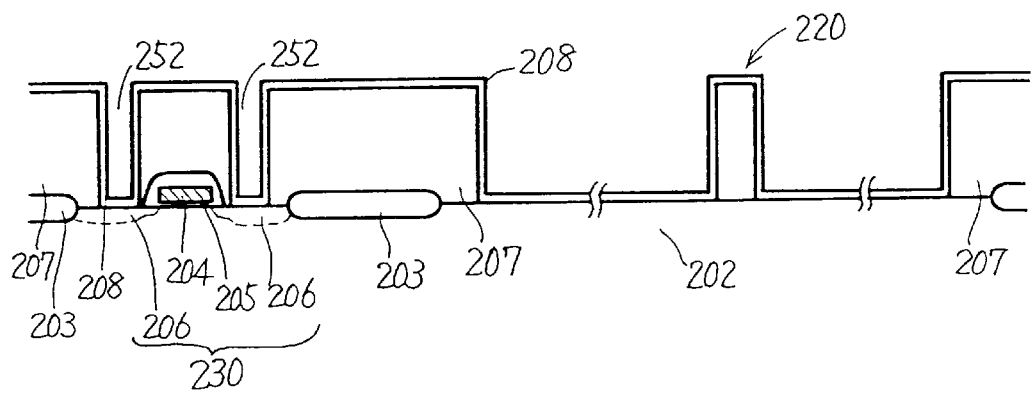
Figure 43:
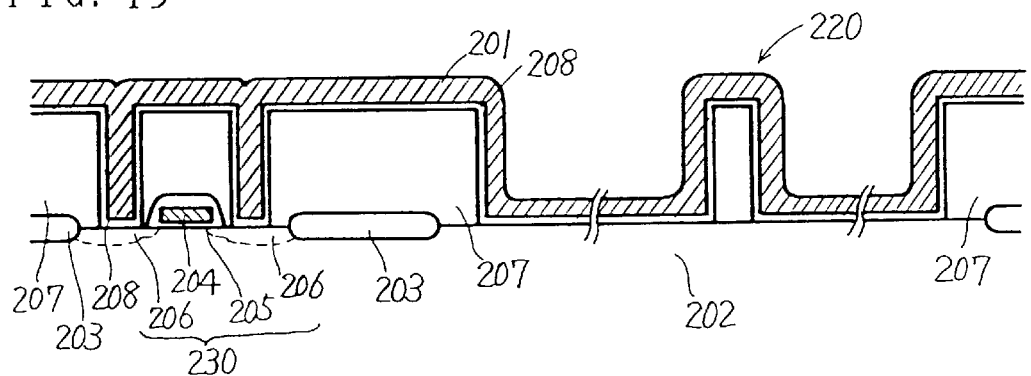
Figure 44:
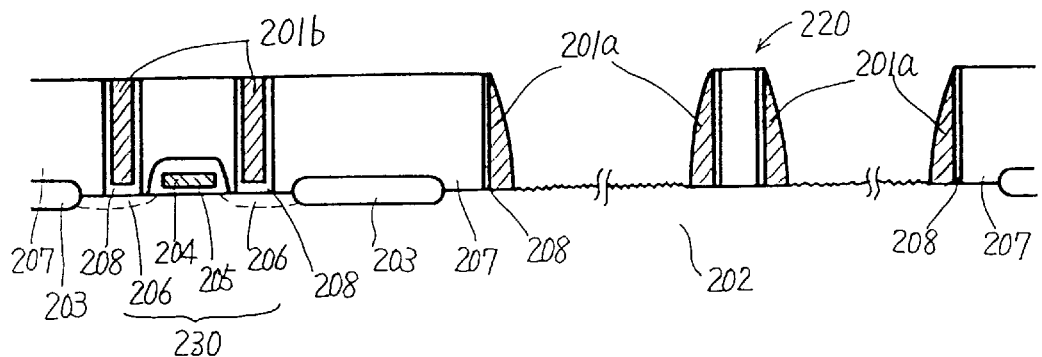
Figure 45:
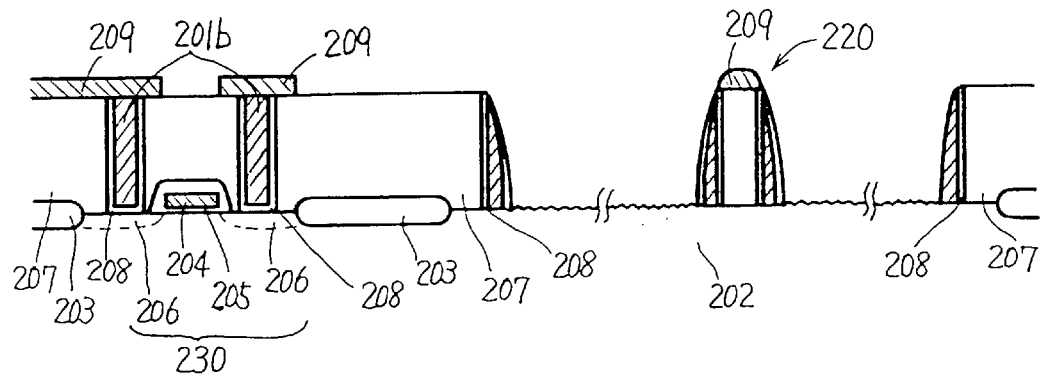
Figure 46:
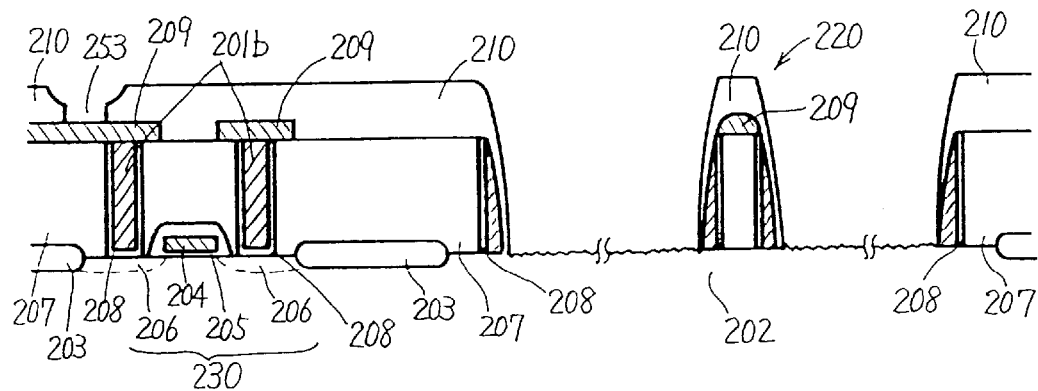
Figure 47:
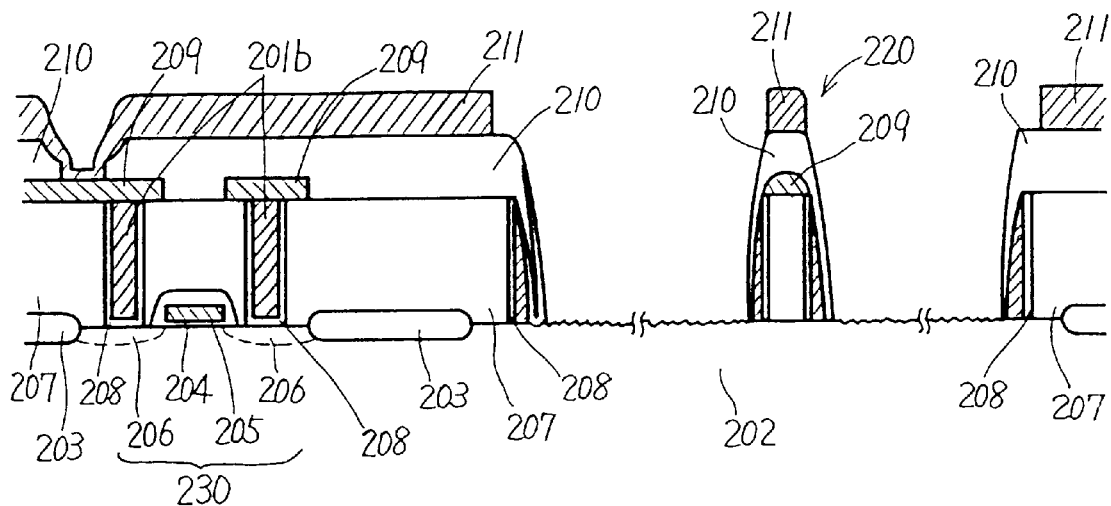
Figure 48:
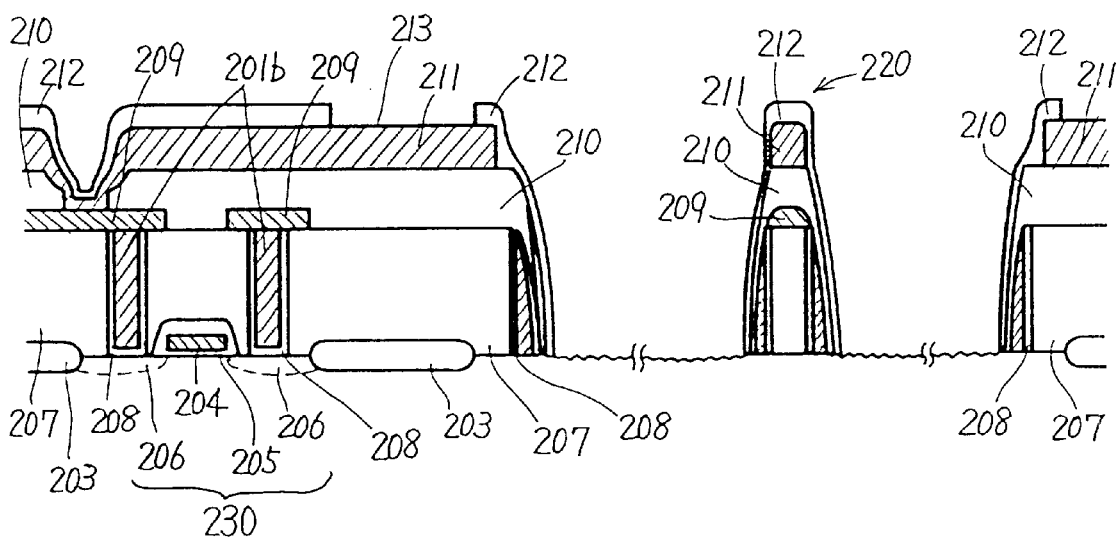
Figure 49:
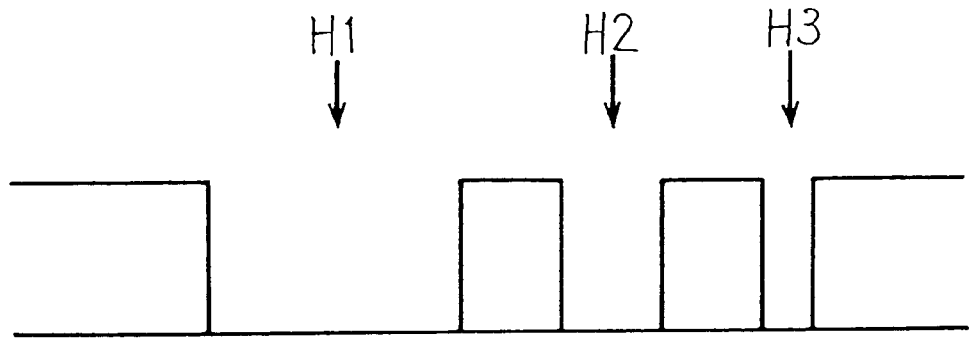
FIG. 49 is a cross section showing the step of forming tungsten plugs in a plurality of contact holes having different diameters.
Figure 49:
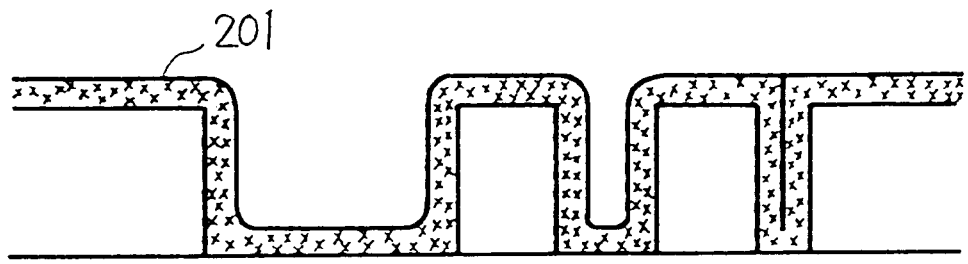
Figure 49:
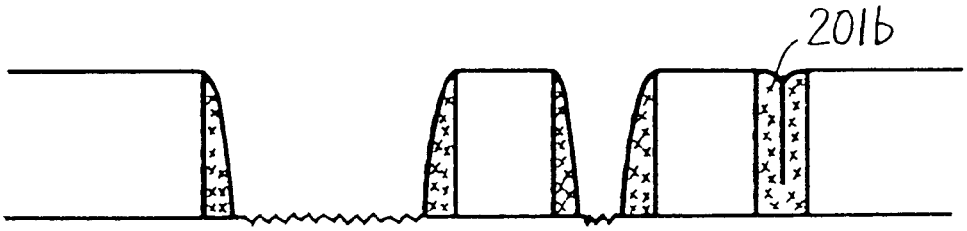
Figure 50:
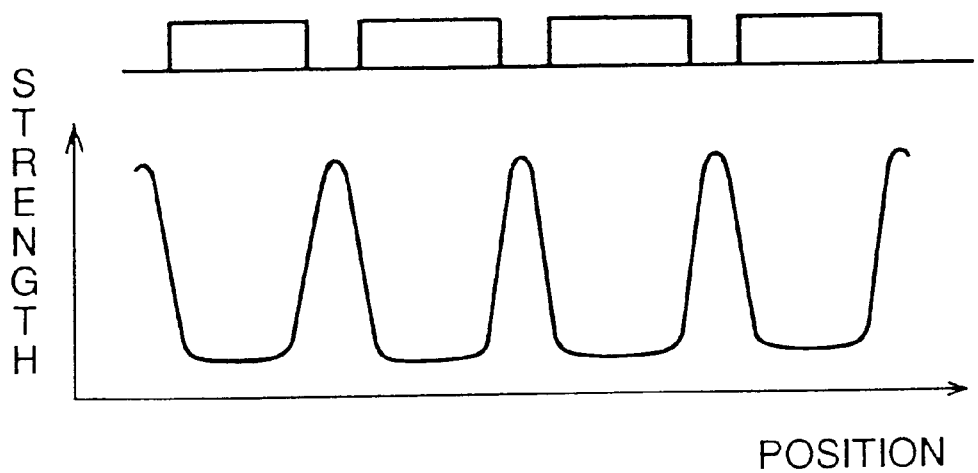
FIG. 50 show cross sections of depressed type (a) and projecting type (b) alignment marks and alignment waveforms when substrate surface is not rough.
Figure 50:
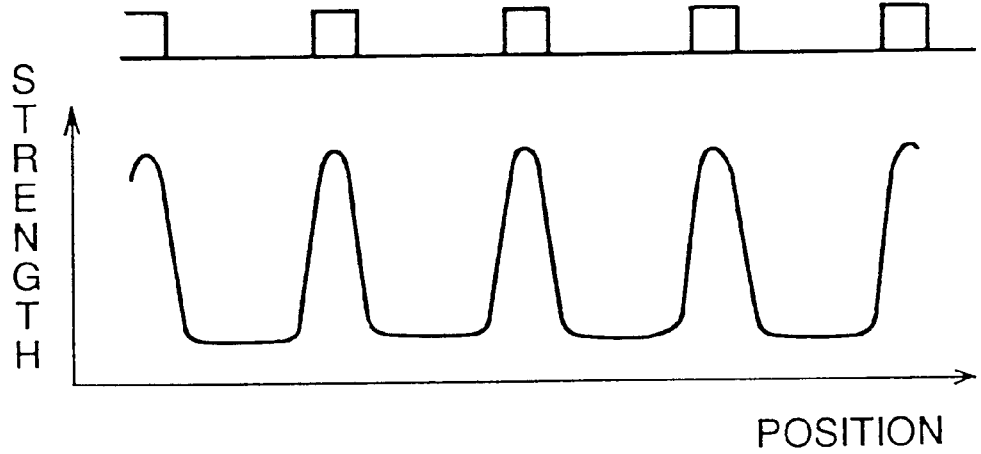
Figure 51:
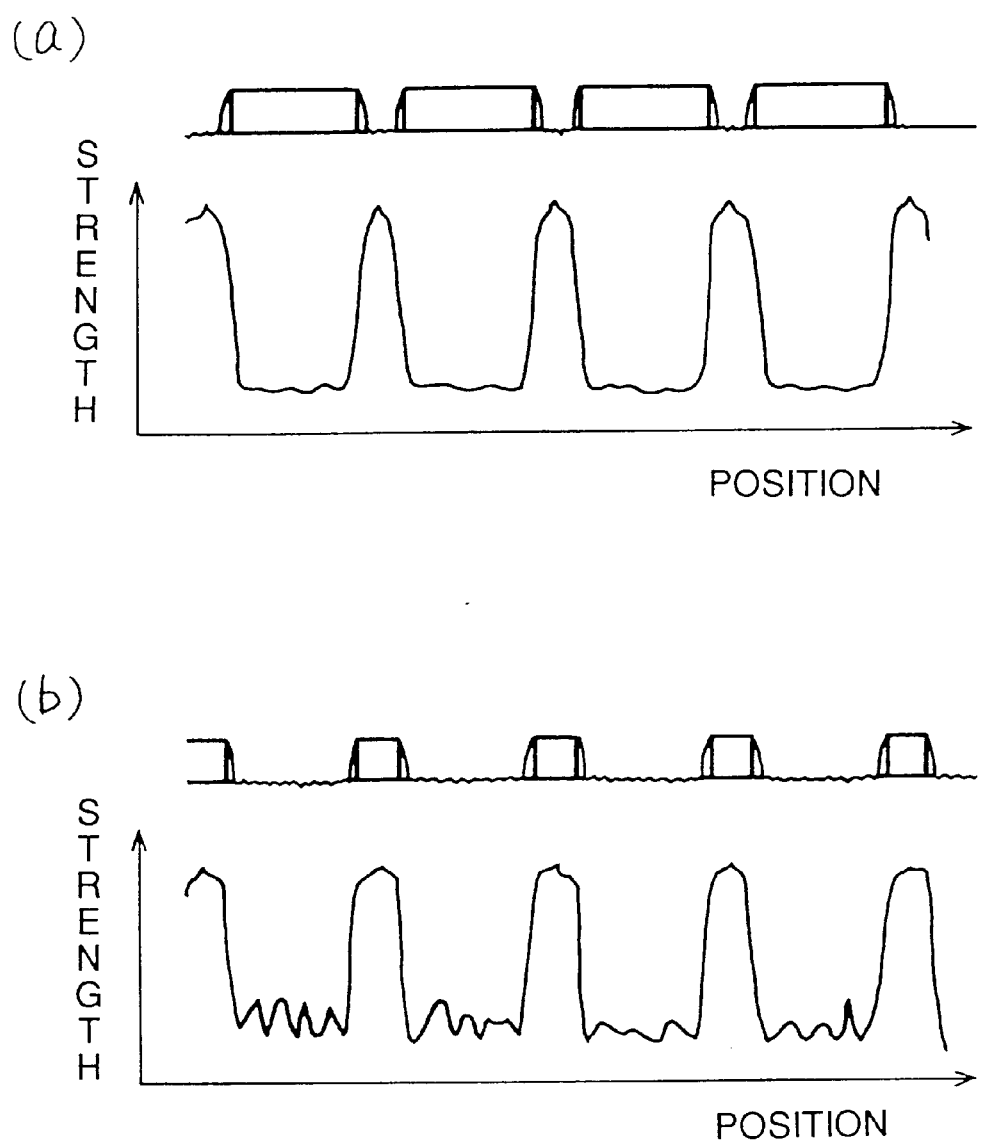
FIG. 51 shows cross sections of depressed type (a) and projecting type (b) alignment marks and alignment waveforms when substrate surface is made rough.
Figure 52:
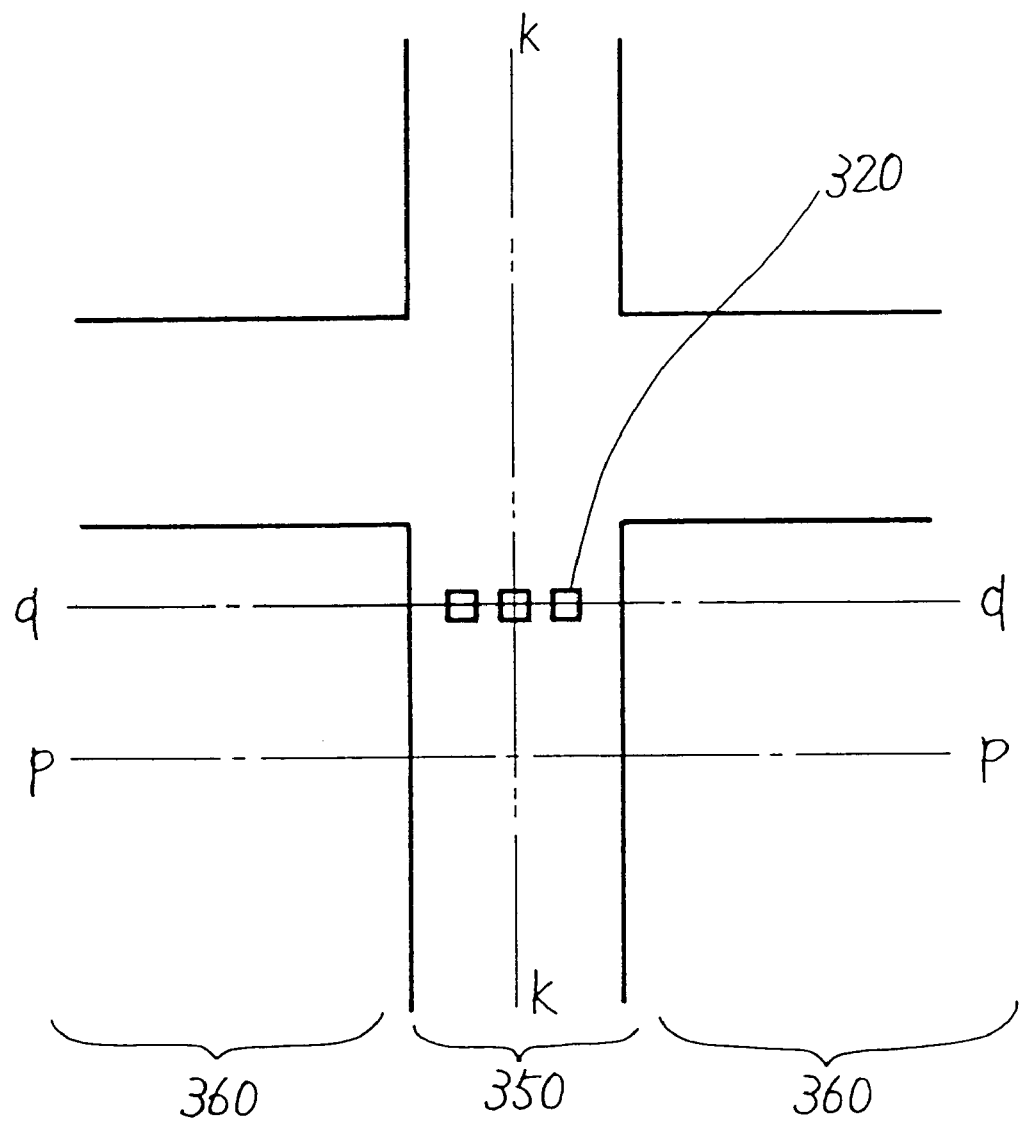
FIG. 52 is an enlarged plan view corresponding to the portion B of FIG. 29.
Figure 53:
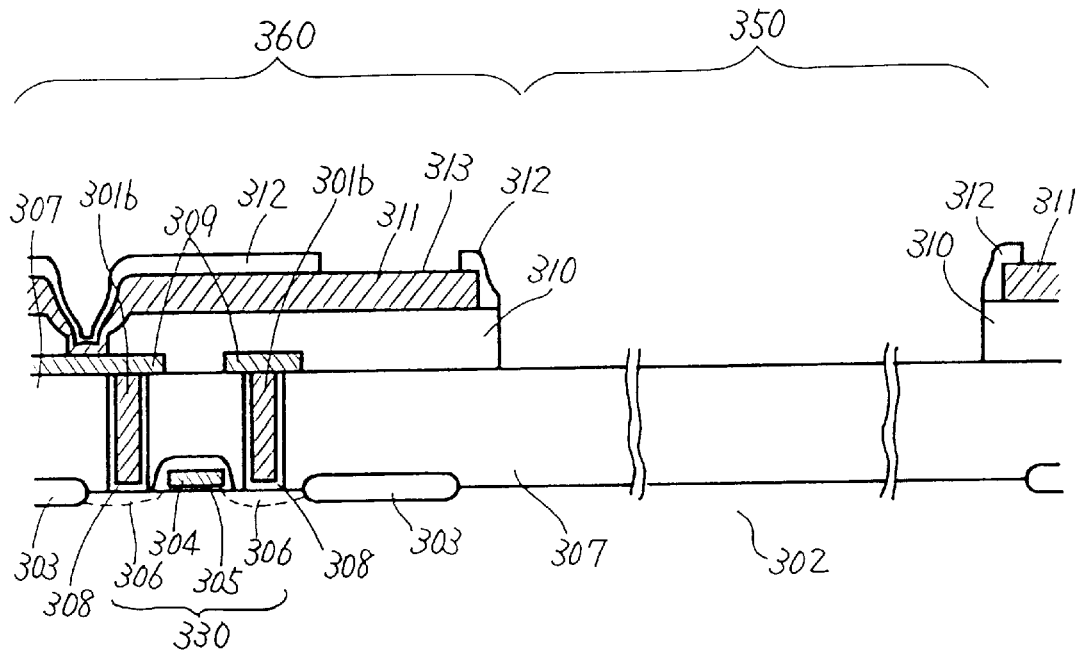
FIG. 53 is a cross section taken along the line p—p of FIG. 52.
Figure 54:
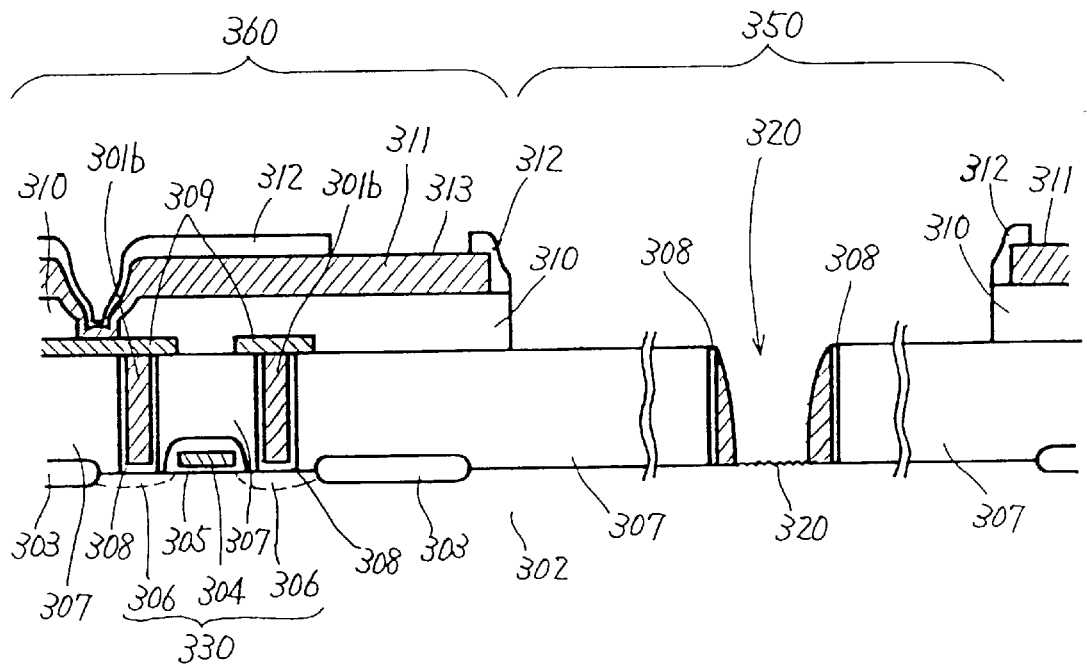
FIG. 54 is a cross section taken along the line q—q of FIG. 52.
Figure 55:
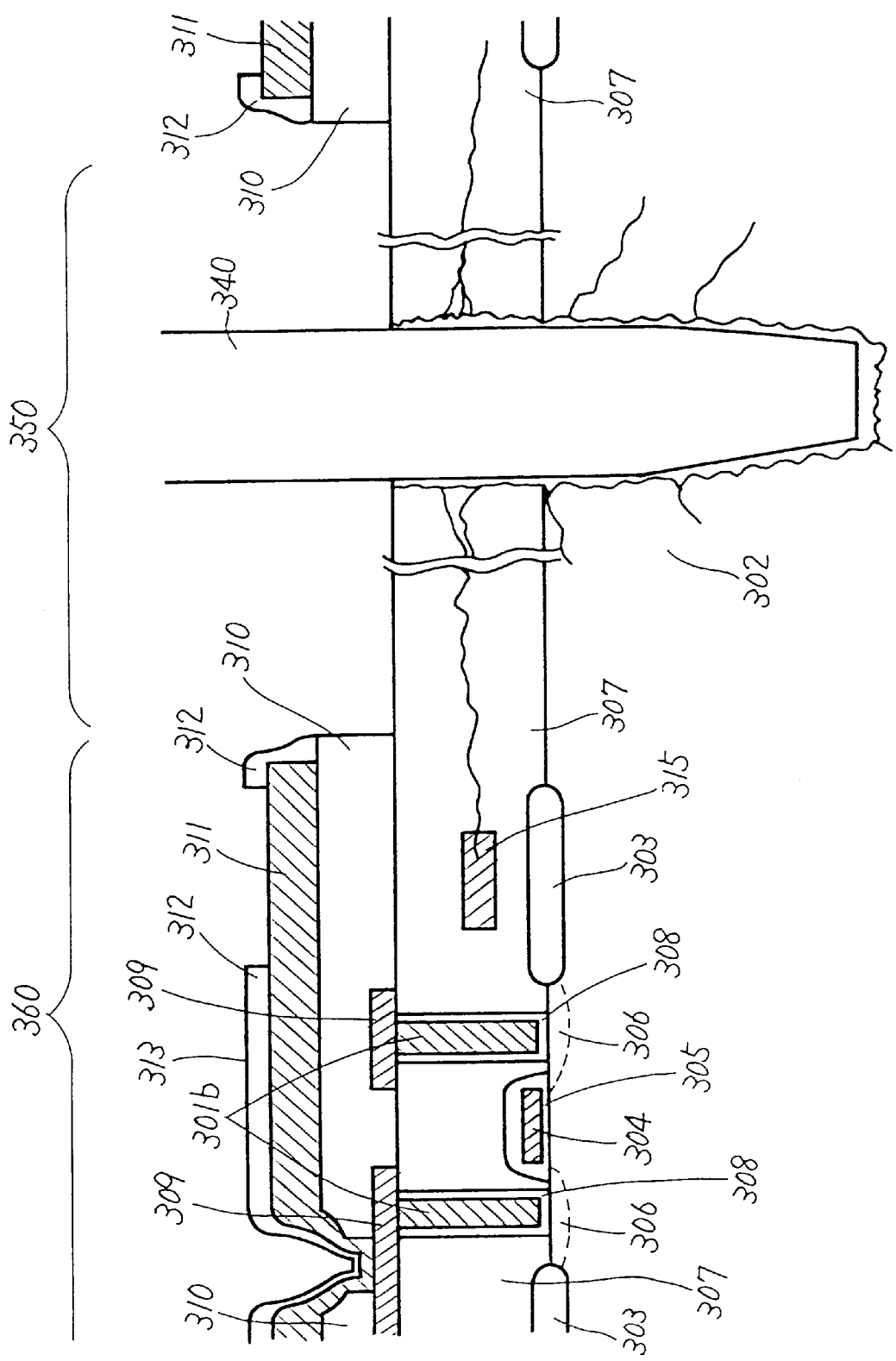
FIG. 55 is a cross section showing the manner of dicing along the line k—k of FIG. 52.
Figure 56:
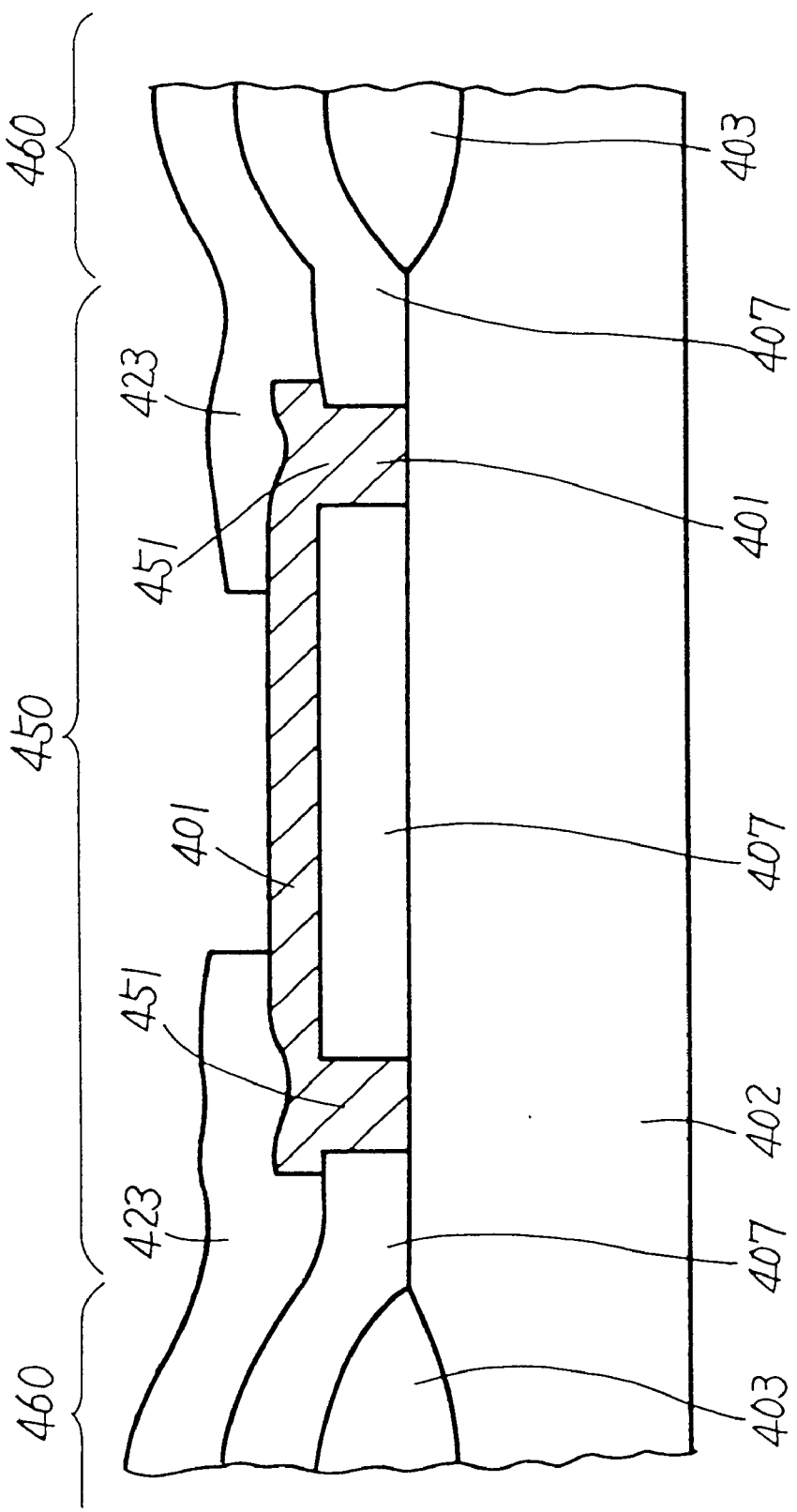
FIG. 56 is a cross section showing schematic structure of a semiconductor device disclosed in the prior art.
Figure 57:
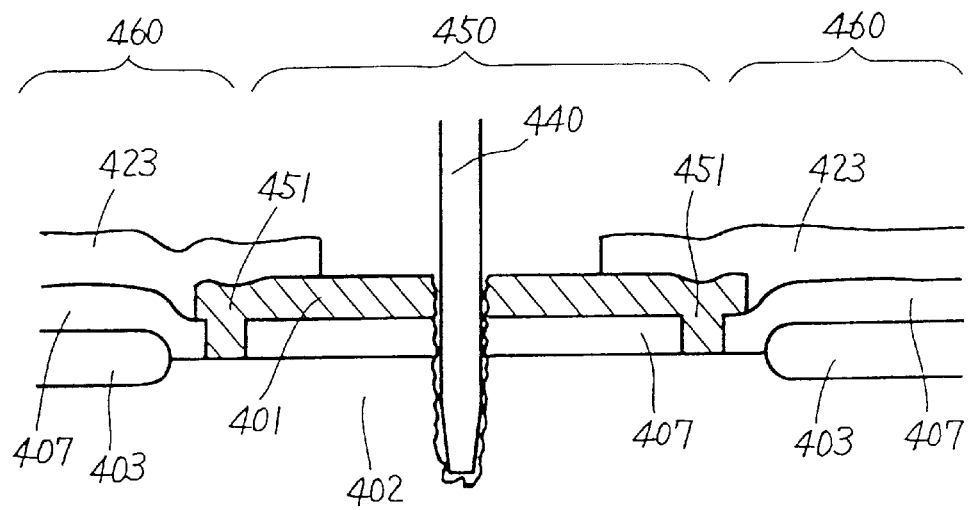
FIG. 57 is a cross section showing the manner of cutting of the semiconductor device disclosed in the prior art.
Figure 58:
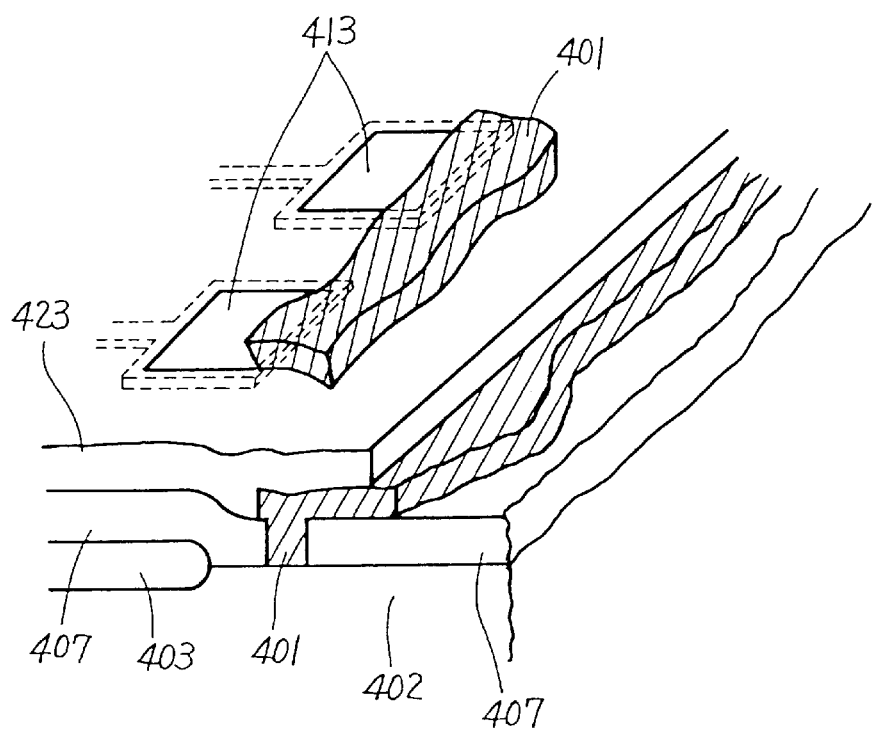
FIG. 58 is a perspective view showing the semiconductor device after cutting disclosed in the prior art.

Although an insulating film is left on the dicing line in the above described embodiments, the insulating film may be removed after the step of FIGS. 14 and 22 so as to provide the structure shown in FIGS. 27 and 28. Referring to FIG. 27, the insulating film 7 is removed from the semiconductor substrate 2 at the dicing line 50. In FIG. 28, the insulating film 7 is removed from semiconductor substrate 2 except the alignment mark 20, at dicing line 50.

Although a tungsten layer formed by the CVD method is filled in the openings formed in the insulating film 7 of the dicing line portion in the above described two embodiments, any material capable of fully filling the openings and providing an interface with the insulating film 7, such as polysilicon, aluminum silicon (AlSi), aluminum•copper (AlCu) or molybdenum (Mo) may be used.

In the semiconductor device, a hole is formed in the first insulating layer. The hole is arranged to surround the device forming region and extending from the top surface of the insulating layer to the main surface of the semiconductor substrate. The hole is filled with a filling layer of a second material. Namely, the filling layer is formed to surround the device forming region. Therefore, short-circuits between layers because of cracks and resulting decrease of reliability can be prevented. The filling layer of the second material has a top surface contiguous to the top surface of the insulating layer. Namely, other than the device forming region, the filling layer of the second material is not formed on the insulating layer in the dicing line portion. Therefore, the blade of the dicer can have a longer life.

In the semiconductor device, the first filling layer formed of a conductive material is formed substantially only in the first hole. Namely, the filling layer is not formed on the insulating layer except in the device forming region. Therefore, when the portion other than the device forming region is cut, it is not necessary to cut the first filling layer formed of the conductive material, and therefore, the first filling layer of the conductive material is not scattered. Therefore, short-circuits between bonding pads can be prevented.

According to the method of manufacturing the semiconductor device, a first filling layer formed of a conductive material is formed substantially only in the first hole, and a second filling layer formed of a conductive material is formed substantially only in the second hole. Therefore, the steps of manufacturing the device can be made simple.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor wafer structure comprising:
   a semiconductor substrate including a plurality of semiconductor device regions each for bearing a semiconductor device, and a plurality of dicing line regions separating said device regions;
   an insulation layer of a first material on a surface of said substrate, wherein said insulation layer has a plurality of apertures, each aperture surrounding a respective one of said device regions and electrically isolating each said device region from the others, and said insulation layer is exposed at a dicing line region; and
   said apertures are each filled with a layer of a second material confined to be within said aperture.

2. The semiconductor wafer structure according to claim 1, wherein said second material is capable of completely filling said apertures and providing an interface with said insulation layer.

3. The semiconductor wafer structure according to claim 1, wherein each said aperture forms a contiguous trench shaped opening around said respective one of said device regions.

4. A semiconductor wafer structure comprising:
   a semiconductor substrate including a plurality of semiconductor device regions each for bearing a semiconductor device, and a plurality of dicing line regions separating said device regions;
   an insulation layer of a first material on a surface of said substrate, wherein said insulation layer has a plurality of openings, each separated from adjacent openings by said first material, surrounding a respective one of said device regions and electrically isolating each said device region from the others; and
   said openings are each filled with a layer of a second material confined to be within said opening.

5. A semiconductor device comprising:
   a semiconductor substrate having a semiconductor device region for bearing a semiconductor device, and a dicing line region separating the semiconductor device region from another device region, and
   an insulation layer of a first material on a surface of said substrate, wherein said insulation layer has an aperture surrounding said device region and filled with a layer of a second material confined to be within said aperture, and said insulation layer is exposed at the dicing line region.

6. The semiconductor device according to claim 5, wherein
   said second material is capable of completely filling said aperture and providing an interface with said insulation layer.

7. The semiconductor device according to claim 5, wherein said aperture forms a contiguous trench shaped opening around said device region.

8. A semiconductor device comprising:
   a semiconductor substrate having a semiconductor device region for bearing a semiconductor device, and
   an insulation layer of a first material on a surface of said substrate, wherein said insulation layer has a plurality of openings, each separated from adjacent openings by said first material and filled with a layer of a second material confined to be within each said opening, surrounding said device region.

9. The semiconductor device according to claim 5, wherein
   said first material comprises silicon oxide.

10. The semiconductor device according to claim 5, wherein
    said device has a field effect transistor.

11. A semiconductor device comprising:
    a semiconductor substrate having a main surface;
    a device forming region bearing a semiconductor device formed on the main surface of said semiconductor substrate;
    an insulating layer of a first material formed to cover said device forming region and create an aperture surrounding said device forming region, wherein said aperture extends from a top surface of said insulating layer toward the main surface of said semiconductor substrate; and
    a filling layer of a second material formed only in said aperture and on the insulating layer in the device forming region.

12. A semiconductor device comprising:
    a semiconductor substrate having a main surface;
    a device forming region bearing a semiconductor device formed on the main surface of said semiconductor substrate;
    an insulating layer of a first material formed to cover said device forming region and create a plurality of openings arranged so as to be spaced apart from each other and surround said device forming region, wherein each of said openings extends from a top surface of said insulating layer toward the main surface of said semiconductor substrate; and
    a filling layer of a second material formed only in said openings and on the insulating layer in the device forming region.

13. The semiconductor device according to claim 11, wherein said aperture forms a contiguous trench shaped opening around said device forming region.

14. The semiconductor device according to claim 11, wherein
said first material comprises silicon oxide.

15. The semiconductor device according to claim 11, wherein
said device has a field effect transistor.

16. A semiconductor device, comprising:
a semiconductor substrate having a main surface;
a device forming region bearing a semiconductor device formed on the main surface of said semiconductor substrate,
a conductive region formed on the main surface of said semiconductor substrate in said device forming region;
an insulating layer formed to cover said device forming region and create (1) a first aperture surrounding said device forming region, wherein said first aperture extends from a top surface of said insulating layer toward the main surface of said semiconductor substrate, and (2) a second aperture extending from the top surface of said insulating layer to said conductive region in said device forming region;
a first filling layer of a conductive material formed only in said first aperture and on the insulating layer in the device forming region; and
a second filling layer of a conductive material formed only in said second aperture and on the insulating layer in the device forming region.

17. The semiconductor device according to claim 16, wherein said device comprises a field effect transistor, and said conductive region has an impurity region of said field effect transistor formed on the main surface of said semiconductor substrate.

18. The semiconductor device according to claim 17, further comprising
an interconnection layer formed on the top surface of said insulating layer, wherein
said second filling layer electrically connects said impurity region to said interconnection layer.

19. The semiconductor device according to claim 18, wherein
said second filling layer further comprises a barrier metal formed to be in contact with the surface of said impurity region.

20. The semiconductor device according to claim 19, wherein
the conductive material of said first filling layer and said second filling layer are each comprised of tungsten.

* * * * *